United States Patent
Yamada et al.

(10) Patent No.: US 8,957,412 B2
(45) Date of Patent: Feb. 17, 2015

(54) ORGANIC ELECTROLUMINESCENCE PANEL, METHOD OF MANUFACTURING ORGANIC ELECTROLUMINESCENCE PANEL, ORGANIC LIGHT EMITTING APPARATUS USING ORGANIC ELECTROLUMINESCENCE PANEL, AND ORGANIC DISPLAY APPARATUS USING ORGANIC ELECTROLUMINESCENCE PANEL

(75) Inventors: Ryuuta Yamada, Kyoto (JP); Keiko Kurata, Hyogo (JP); Shinya Fujimura, Osaka (JP); Hirofumi Fujita, Osaka (JP); Yoshiaki Tsukamoto, Osaka (JP); Takahiro Komatsu, Osaka (JP); Satoru Ohuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 13/988,372

(22) PCT Filed: Nov. 29, 2010

(86) PCT No.: PCT/JP2010/006928
§ 371 (c)(1),
(2), (4) Date: May 20, 2013

(87) PCT Pub. No.: WO2012/073269
PCT Pub. Date: Jun. 7, 2012

(65) Prior Publication Data
US 2013/0234129 A1 Sep. 12, 2013

(51) Int. Cl.
*H01L 27/32* (2006.01)
*H01L 51/56* (2006.01)
(Continued)

(52) U.S. Cl.
CPC ............ *H01L 27/32* (2013.01); *H01L 27/3211* (2013.01); *H01L 51/5056* (2013.01);
(Continued)

(58) Field of Classification Search
CPC ............ H01L 27/3211; H01L 51/5048; H01L 51/5012; H01L 51/5262; H01L 51/5056; H01L 51/5092; H01L 51/5088; H01L 51/56; H01L 27/3244; H01L 27/3246; H01L 27/32
USPC ....................... 257/40, 79, 88; 438/34, 35, 46
See application file for complete search history.

(56) References Cited

U.S. PATENT DOCUMENTS

| | | | |
|---|---|---|---|
| 5,443,922 | A | 8/1995 | Nishizaki et al. |
| 7,888,867 | B2 | 2/2011 | Yoshida et al. |

(Continued)

FOREIGN PATENT DOCUMENTS

| | | |
|---|---|---|
| EP | 1862524 A1 * | 12/2007 |
| JP | 05-163488 | 6/1993 |

(Continued)

OTHER PUBLICATIONS

U.S. Appl. No. 13/821,327 to Kou Sugano et al., filed Mar. 7, 2013.
(Continued)

*Primary Examiner* — Whitney T Moore
(74) *Attorney, Agent, or Firm* — Greenblum & Bernstein, P.L.C.

(57) ABSTRACT

An organic EL panel comprises anodes, a cathode, organic light-emitting layers, and first functional layers each including a hole injection layer and a hole transport layer. The hole injection layer of each of the R, G, and B colors is made of only a metal oxide including tungsten oxide, and has a thickness of 5 nm to 40 nm. At least one of the hole injection layers has a thickness different from the other hole injection layers. The hole transport layers of the R, G, and B colors are equivalent in thickness. The organic light-emitting layers of the R, G, and B colors are equivalent in thickness.

27 Claims, 20 Drawing Sheets

(51) Int. Cl.
*H01L 51/50* (2006.01)
*H01L 51/52* (2006.01)

(52) U.S. Cl.
CPC ............ *H01L51/5088* (2013.01); *H01L 51/56* (2013.01); *H01L 51/5265* (2013.01); *H01L 2251/558* (2013.01)
USPC ............................................. 257/40; 438/35

(56) References Cited

U.S. PATENT DOCUMENTS

| | | | |
|---|---|---|---|
| 8,217,573 B2 | 7/2012 | Yoshida et al. | |
| 8,324,617 B2 | 12/2012 | Okumoto et al. | |
| 8,492,184 B2 | 7/2013 | Nishiyama et al. | |
| 8,492,754 B2 | 7/2013 | Nishiyama et al. | |
| 2006/0158103 A1 | 7/2006 | Katano et al. | |
| 2008/0119352 A1* | 5/2008 | Kitaguchi | 502/74 |
| 2008/0280162 A1* | 11/2008 | Morii | 428/690 |
| 2010/0102310 A1 | 4/2010 | Komatsu et al. | |
| 2011/0291128 A1 | 12/2011 | Harada et al. | |
| 2012/0104423 A1 | 5/2012 | Kurata et al. | |
| 2012/0217518 A1 | 8/2012 | Abe et al. | |
| 2012/0241780 A1 | 9/2012 | Kurata et al. | |
| 2013/0105781 A1 | 5/2013 | Matsushima | |
| 2013/0146861 A1 | 6/2013 | Kurata et al. | |
| 2013/0153883 A1 | 6/2013 | Kurata et al. | |
| 2013/0193427 A1 | 8/2013 | Kurata et al. | |

FOREIGN PATENT DOCUMENTS

| | | | |
|---|---|---|---|
| JP | 2002-252087 | | 6/2002 |
| JP | 2006179780 A | * | 7/2006 |
| JP | 4046948 | | 2/2008 |
| JP | 2009-044103 | | 2/2009 |
| JP | 2010-010670 | | 1/2010 |
| JP | 2010-103374 | | 5/2010 |
| JP | 2010-108706 | | 5/2010 |
| JP | 2010-165461 | | 7/2010 |
| WO | 2006/008987 | | 1/2006 |
| WO | 2010/092795 | | 8/2010 |

OTHER PUBLICATIONS

U.S. App. No. 13/819,059 to Keiko Kurata et al., filed Feb. 26, 2013.

Kaname Kanai et al., "Electronic structure of anode interface with molybdenum oxide buffer layer", Organic Electronics 11, pp. 188-194 (2010).

Jingze Li et al., "Enhanced performance of organic light emitting device by insertion of conducting/insulating WO3 anodic buffer layer", Syntetic Metals 151, pp. 141-146 (2005).

I. N. Yakovkin et al., "Driving force for the WO3(001) surface relaxation", Surface Science 601, pp. 1481-1488 (2007).

International Search Report (ISR) in International Application No. PCT/JP2010/006928, dated Feb. 15, 2011.

\* cited by examiner

| EML film thickness (nm) | 55 | 65 | 75 | 85 | 95 | 105 |
|---|---|---|---|---|---|---|
| Driving voltage (V) @10mA | 6.0 | 6.6 | 6.8 | 8.1 | 8.3 | 9.4 |

| IL film thickness (nm) | 30 | 60 | 80 | 100 |
|---|---|---|---|---|
| Driving voltage (V) @10mA | 9.6 | 10.5 | 11.5 | 12.3 |

| WOx film thickness (nm) | 5 | 10 | 15 | 20 | 25 | 30 | 35 | 40 |
|---|---|---|---|---|---|---|---|---|
| Driving voltage (V) @10mA | 6.8 | 6.8 | 6.8 | 6.7 | 6.7 | 6.8 | 6.7 | 6.7 |

FIG. 5A

| | | | R | G | B |
|---|---|---|---|---|---|
| Comparative example 1 | Film thicknes [nm] | Electron transport layer | 30 | 30 | 30 |
| | | Organic light-emitting layer | 80 | 80 | 50 |
| | | Hole transport layer | 10 | 10 | 10 |
| | | Hole injection layer | 5 | 5 | 5 |
| | | Transparent conductive layer | 16 | 16 | 16 |
| | Current efficiency [cd/A] | | 7.9 | 41 | 2.2 |
| | Chromaticity [x, y] | | (0.67, 0.33) | (0.28, 0.66) | (0.13, 0.074) |
| | Driving voltage [V] | | 6.1 | 8.2 | 6.2 |
| | Power consumption [W] | | 2.98 | 5.06 | 19.07 |
| | Total power consumption [W] | | 27.11 | | |
| | | | R | G | B |
| Example 1-1 | Film thicknes [nm] | Electron transport layer | 30 | 30 | 30 |
| | | Organic light-emitting layer | 40 | 40 | 40 |
| | | Hole transport layer | 10 | 10 | 10 |
| | | Hole injection layer | 38 | 32 | 10 |
| | | Transparent conductive layer | 16 | 16 | 16 |
| | Thickness of 1st functional layer [nm] | | 64 | 58 | 36 |
| | Optical distance [nm] | | 122 | 113 | 72 |
| | Current efficiency [cd/A] | | 9.3 | 40 | 2.2 |
| | Chromaticity [x, y] | | (0.67, 0.33) | (0.29, 0.66) | (0.13, 0.074) |
| | Driving voltage [V] | | 4.4 | 4.9 | 5.4 |
| | Power consumption [W] | | 2.39 | 4.07 | 15.31 |
| | Total power consumption [W] | | 21.77 | | |
| | | | R | G | B |
| Example 1-2 | Film thicknes [nm] | Electron transport layer | 35 | 35 | 35 |
| | | Organic light-emitting layer | 40 | 40 | 40 |
| | | Hole transport layer | 15 | 15 | 15 |
| | | Hole injection layer | 38 | 28 | 6 |
| | | Transparent conductive layer | 16 | 16 | 16 |
| | Thickness of 1st functional layer [nm] | | 69 | 59 | 37 |
| | Optical distance [nm] | | 131 | 122 | 81 |
| | Current efficiency [cd/A] | | 9.3 | 39 | 2.2 |
| | Chromaticity [x, y] | | (0.67, 0.33) | (0.29, 0.66) | (0.13, 0.075) |
| | Driving voltage [V] | | 4.6 | 5.1 | 5.6 |
| | Power consumption [W] | | 2.43 | 4.14 | 15.58 |
| | Total power consumption [W] | | 22.15 | | |

FIG. 5B

| | | R | G | B |
|---|---|---|---|---|
| Refractive index | Electron transport layer | 1.84 | 1.78 | 1.76 |
| | Organic light-emitting layer | 1.74 | 1.69 | 1.84 |
| | Hole transport layer | 1.72 | 1.74 | 1.83 |
| | Hole injection layer | 1.93 | 1.98 | 2.03 |
| | Transparent conductive layer | 1.98 | 2.04 | 2.10 |

FIG. 6

| | | | R | G | B |
|---|---|---|---|---|---|
| Comparative example 2 | Film thicknes [nm] | Electron transport layer | 30 | 30 | 30 |
| | | Organic light-emitting layer | 80 | 80 | 50 |
| | | Hole transport layer | 10 | 10 | 10 |
| | | Hole injection layer | 5 | 5 | 5 |
| | | Transparent conductive layer | 16 | 16 | 16 |
| | Current efficiency [cd/A] | | 7.9 | 41 | 2.2 |
| | Chromaticity [x, y] | | (0.67, 0.33) | (0.28, 0.66) | (0.13, 0.074) |
| | Driving voltage [V] | | 6.1 | 8.2 | 6.2 |
| | Power consumption [W] | | 12.66 | 20.91 | 67.43 |
| | Total power consumption [W] | | | 101.00 | |
| | | | R | G | B |
| Example 2-1 | Film thicknes [nm] | Electron transport layer | 30 | 30 | 30 |
| | | Organic light-emitting layer | 40 | 40 | 40 |
| | | Hole transport layer | 10 | 10 | 10 |
| | | Hole injection layer | 38 | 32 | 10 |
| | | Transparent conductive layer | 16 | 16 | 16 |
| | Thickness of 1st functional layer [nm] | | 64 | 58 | 36 |
| | Optical distance [nm] | | 122 | 113 | 72 |
| | Current efficiency [cd/A] | | 9.3 | 40 | 2.2 |
| | Chromaticity [x, y] | | (0.67, 0.33) | (0.29, 0.66) | (0.13, 0.074) |
| | Driving voltage [V] | | 4.4 | 4.9 | 5.4 |
| | Power consumption [W] | | 10.16 | 16.78 | 54.13 |
| | Total power consumption [W] | | | 81.08 | |
| | | | R | G | B |
| Example 2-2 | Film thicknes [nm] | Electron transport layer | 35 | 35 | 35 |
| | | Organic light-emitting layer | 40 | 40 | 40 |
| | | Hole transport layer | 15 | 15 | 15 |
| | | Hole injection layer | 38 | 28 | 6 |
| | | Transparent conductive layer | 16 | 16 | 16 |
| | Thickness of 1st functional layer [nm] | | 69 | 59 | 37 |
| | Optical distance [nm] | | 131 | 122 | 81 |
| | Current efficiency [cd/A] | | 9.3 | 40 | 2.2 |
| | Chromaticity [x, y] | | (0.67, 0.33) | (0.29, 0.66) | (0.13, 0.074) |
| | Driving voltage [V] | | 4.6 | 5.1 | 5.6 |
| | Power consumption [W] | | 10.34 | 17.08 | 55.08 |
| | Total power consumption [W] | | | 82.50 | |

FIG. 8A
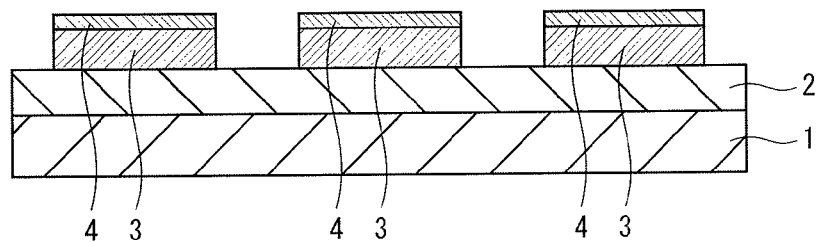
FIG. 8B
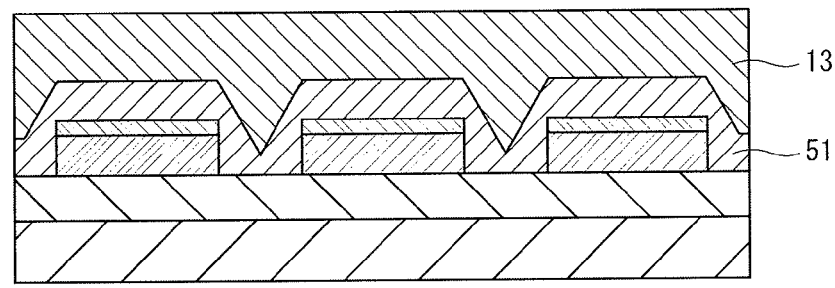
FIG. 8C
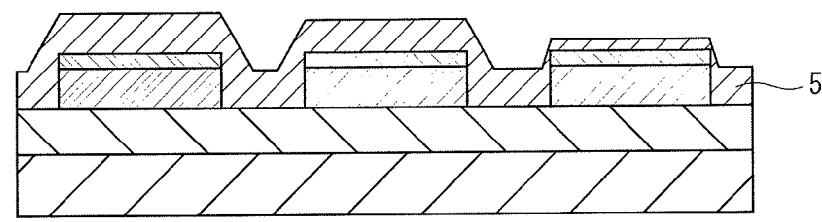
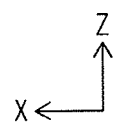

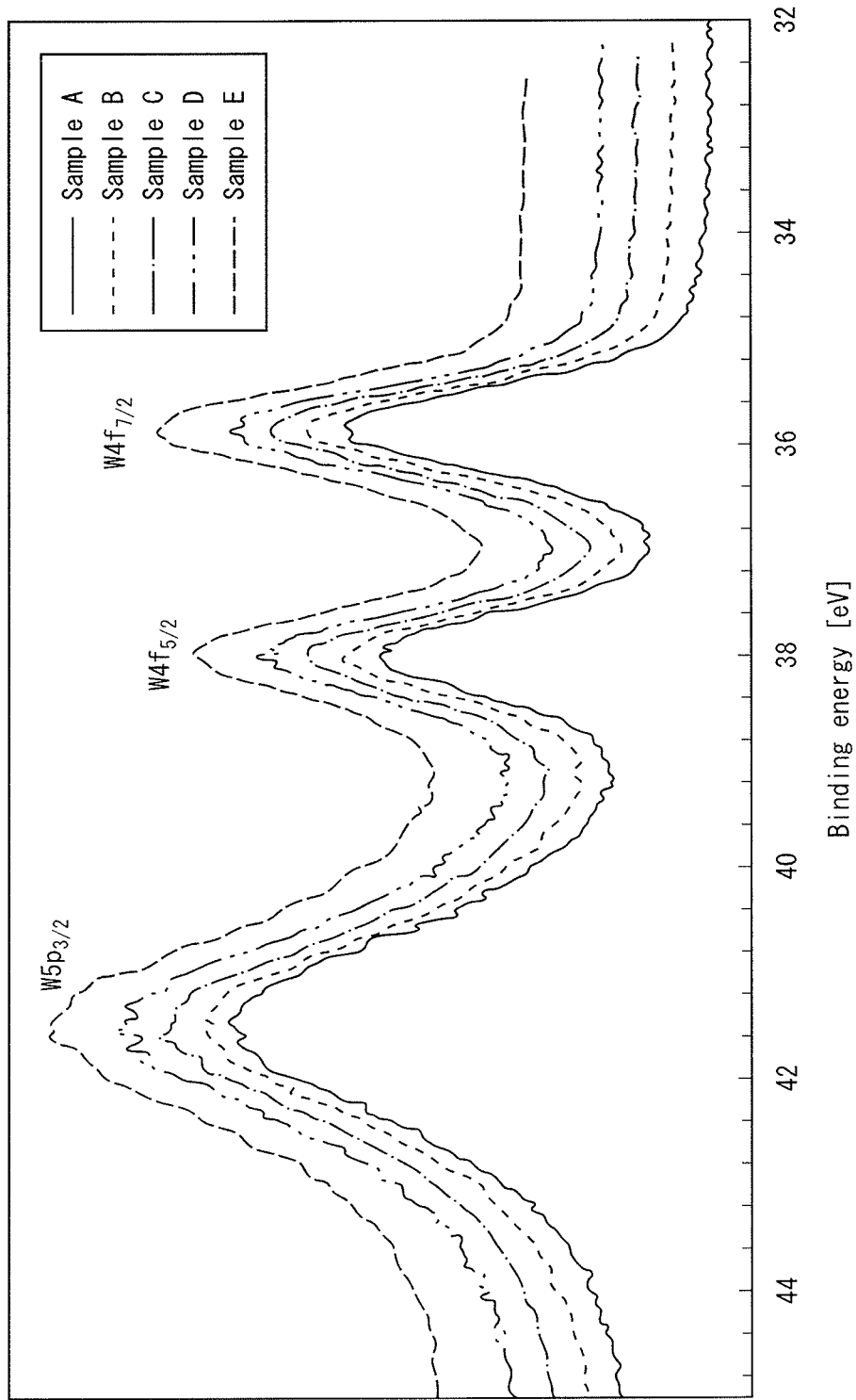

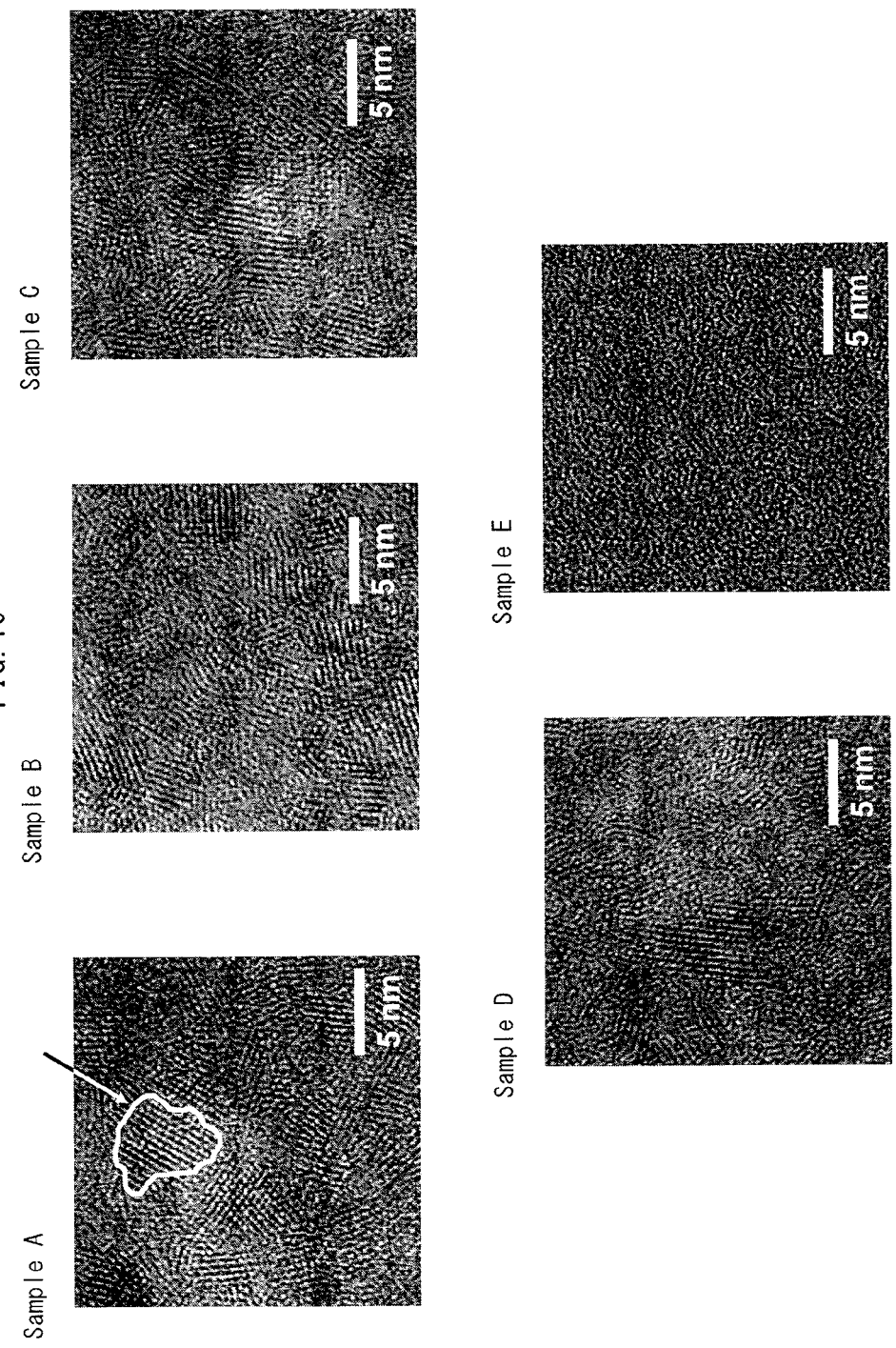

ORGANIC ELECTROLUMINESCENCE PANEL, METHOD OF MANUFACTURING ORGANIC ELECTROLUMINESCENCE PANEL, ORGANIC LIGHT EMITTING APPARATUS USING ORGANIC ELECTROLUMINESCENCE PANEL, AND ORGANIC DISPLAY APPARATUS USING ORGANIC ELECTROLUMINESCENCE PANEL

TECHNICAL FIELD

The present invention relates to an organic EL panel, a manufacturing method of the organic EL panel, an organic light-emitting device using the organic EL panel, and an organic display device using the organic EL panel.

BACKGROUND ART

In recent years, progress has been made in the research and development of organic EL panels. The organic EL panels are display panels that rely on the phenomenon of electroluminescence of an organic material. A matrix of R (red), G (green), and B (blue) subpixels is arranged on a substrate of such an organic EL panel.

It is important to improve light-extraction efficiency of the R, G, and B subpixels, from the standpoint of reducing power consumption or increasing service life of the organic EL panel.

To this end, Patent Literature 1 proposes an art of increasing transmitted-light intensity of an organic light-emitting display device constituted of a reflective film, an interlayer insulation film, a first transparent electrode, a hole transport layer, an organic light-emitting layer, an electron injection layer, and a second transparent electrode that are layered on a substrate. Incident-light intensity is increased by using the phenomenon of interference between direct light that travels directly from the organic light-emitting layer toward the second transparent electrode and reflective light that reflects off the reflective film after being emitted from the organic light-emitting layer and then travels toward the second transparent electrode (paragraphs 0022-0024).

CITATION LIST

Patent Literature

[Patent Literature 1]
Japanese Patent Publication No. 4046948

SUMMARY OF INVENTION

Technical Problem

In recent years, large-sized organic EL panels have been prevalent, and reduction of power consumption is becoming increasingly important. Accordingly, there is a demand for further reduction of driving voltage.

An aim of the present invention is to provide an organic EL panel with lower power consumption.

Solution to Problem

In order to solve the above problems, one aspect of the present invention is an organic EL panel comprising: a plurality of anodes that are disposed in one-to-one correspondence with R (red), G (green), and B (blue) colors and reflect light; a cathode that is disposed to face the anodes and transmits light therethrough; a plurality of organic light-emitting layers that are disposed between the anodes and the cathode, correspond one-to-one with the R, G, and B colors, and each emit light of the corresponding color due to voltage application between the anodes and the cathode; and a plurality of first functional layers that are disposed between the anodes and the organic light-emitting layers, correspond one-to-one with the R, G, and B colors, and are each constituted of at least two layers including a hole injection layer for injecting holes and a hole transport layer provided on the hole injection layer and for transporting the holes to the organic light-emitting layer of the corresponding color, wherein a first portion of light of each of the R, G, and B colors emitted from the organic light-emitting layer of the corresponding color travels through the first functional layer of the corresponding color toward the anode of the corresponding color, strikes and is reflected by the anode, and then emitted externally after passing through the first functional layer of the corresponding color, the organic light-emitting layer of the corresponding color, and the cathode, and a second portion of the light of each of the R, G, and B colors travels toward the cathode instead of toward the anode of the corresponding color, and is emitted externally after passing through the cathode, the hole injection layer of each of the R, G, and B colors is made of only a metal oxide including tungsten oxide, and has a thickness of 5 nm to 40 nm, at least one of the hole injection layers having a thickness different from the other hole injection layers, the hole transport layers of the R, G, and B colors are equivalent in thickness, and the organic light-emitting layers of the R, G, and B colors are equivalent in thickness.

Advantageous Effects of Invention

In the organic EL panel according to one aspect of the present invention, the hole transport layers of the R, G, and B colors are equivalent in thickness; the organic light-emitting layers of the R, G, and B colors are also equivalent in thickness; and adjustment is made in the thickness of each of the hole injection layers of the R, G, and B colors. The hole injection layers of the R, G, and B colors are made of only a metal oxide including tungsten oxide, and each have a thickness of 5 nm to 40 nm.

This makes it possible to cause the driving voltage for obtaining a predetermined current density to be nearly constant, preventing an increase in the driving voltage due to an increase in film thickness. Even if one of the hole injection layers of the R, G, and B colors is thicker than the others as a result of film thickness adjustment, the driving voltage at the thicker hole injection layer is nearly equal to the thinner hole injection layers. This allows for reduction in driving voltage in the organic EL panel as a whole.

BRIEF DESCRIPTION OF DRAWINGS

FIG. 5A shows conditions and results of simulations in which light-extraction efficiency is adjusted by changing the thickness of the hole injection layer for each of R, G, and B colors (Examples 1-1 and 1-2), and in which light-extraction efficiency is adjusted by changing the thickness of the organic light-emitting layer for each of R, G, and B colors (Comparative example 1). FIG. 5B shows the refractive index of each of the hole transport layer, the hole injection layer, and a transparent conductive layer.

FIG. 6 shows conditions and results of simulations in which light-extraction efficiency is adjusted by changing the thickness of the hole injection layer for each of R, G, and B colors (Examples 2-1 and 2-2), and in which light-extraction efficiency is adjusted by changing the thickness of the organic light-emitting layer for each of R, G, and B colors (Comparative example 2).

FIGS. 8A to 8C show an example of preceding steps in the manufacturing process of the organic EL panel 10 according to the embodiment.

FIG. 14 shows spectra belonging to $W5p_{3/2}$, $W4f_{5/2}$, and $W4f_{7/2}$, obtained by XPS measurement of the surface of a tungsten oxide layer.

FIG. 19 shows cross-sectional TEM photographs of the tungsten oxide layer.

DESCRIPTION OF EMBODIMENT

Figure 1:
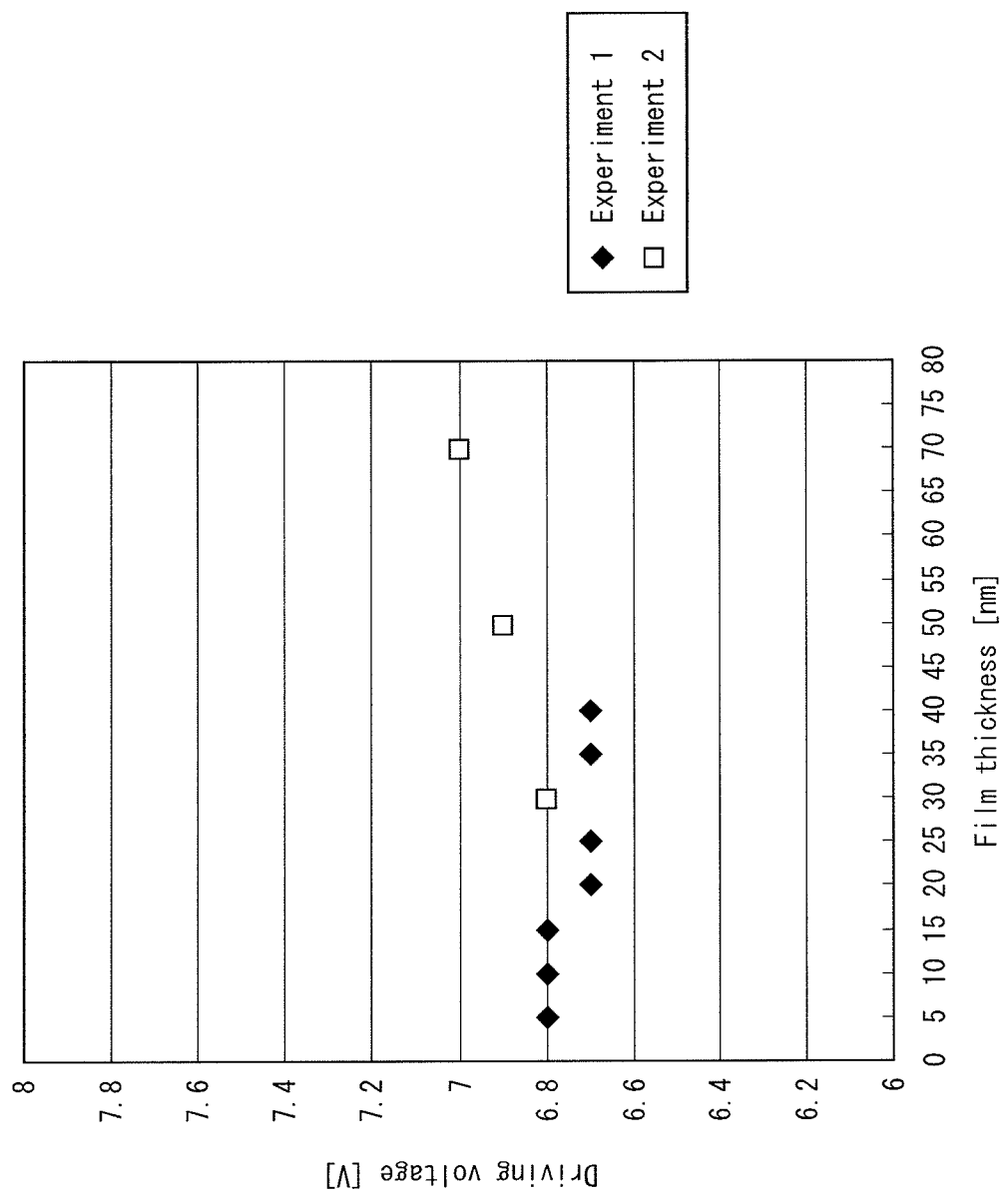
FIG. 1 shows the relationship between the thickness of a hole injection layer and driving voltage.

[Process by which Aspect of the Present Invention was Achieved]

Before concretely describing one aspect of the present invention, the following describes the process by which the aspect of the present invention was achieved.

In organic EL panels, a cavity structure is conventionally employed to adjust light-extraction efficiency. In the cavity structure, for example, a reflective anode having light reflectivity and a transparent cathode having light transmissivity are used. Between the reflective anode and the transparent cathode, an organic light-emitting layer is disposed, and between the reflective anode and the organic light-emitting layer, a functional layer constituted of at least one layer is disposed.

According to such a cavity structure, a first portion of light emitted from the organic light-emitting layer travels through the functional layer toward the anode, strikes and is reflected by the anode, and then emitted externally after passing through the functional layer, the organic light-emitting layer, and the cathode. Also, a second portion of light, which is the remaining portion of the light emitted from the organic light-emitting layer, travels toward the cathode instead of toward the anode, and is emitted externally after passing through the cathode.

In this cavity structure, light-extraction efficiency is adjusted by setting the optical thickness of each of the organic light-emitting layer and the functional layer. In this case, generally, either the thickness of the organic light-emitting layer or the thickness of a hole transport layer in the functional layer is appropriately determined so as to adjust the light-extraction efficiency of an organic EL panel. This is because the organic light-emitting layer, and the hole transport layer, which is made of an organic material and transports holes to the organic light-emitting layer, are both formed by an application method such as an inkjet method. Forming these layers by an application method makes it relatively easy to control film thickness.

As a result of intense study, the inventors of the present invention discovered the following with regard to the aforementioned organic EL panel. That is, when the thickness of either the organic light-emitting layer or the hole transport layer is appropriately set to adjust the light-extraction efficiency, the driving voltage necessary to obtain a predetermined current density is varied. Specifically, the inventors discovered that an increase in film thickness causes an increase in driving voltage. Details of experiments and results thereof that led to the discovery are described later with use of FIGS. 2A and 2B, and FIGS. 3A and 3B.

Based on the discovery, the inventors focused on a hole injection layer which is included in the functional layer and injects, to the hole transport layer, holes injected from the anode, and arrived at the idea of adjusting light-extraction efficiency by appropriately adjusting the thickness of the hole injection layer instead of the organic light-emitting layer or the hole transport layer.

Conventionally, hole injection layers are made of an organic material such as PEDOT, i.e., polythiophene and poly (ethylenedioxy) thiophenes or of an inorganic material such as metal oxide. In terms of simplifying the adjustment of film thickness, a person skilled in the art is likely to select an organic material so that a hole injection layer can be formed by an application method. Contrary to this common technical knowledge, the inventors considered forming a hole injection layer with use of an inorganic material, in particular, metal oxide, which requires a vapor deposition method or a sputtering method.

The inventors conducted experiments on a hole injection layer formed under a predetermined condition. The hole injection layer was made of tungsten oxide that is metal oxide, and the thicknesses of the hole injection layer were set to 30 nm, 50 nm, and 70 nm. The hole injection layer was made of only tungsten oxide without inclusion of any organic material. This is because organic materials are less conductive than metal oxide, and the inventors considered that inclusion of an organic material increases driving voltage and makes it difficult to reduce driving voltage. FIG. 1 shows the results of the experiments. According to the experiments, however, as the thickness of the hole injection layer increases, driving voltage tends to be higher (see experiment 2 in FIG. 1). Based on the above experiment results, adjusting light-extraction efficiency by setting the thickness of the hole injection layer does not seem to be quite effective.

However, the inventors did not give up after the experiment results, and conducted a series of studies. Then, the inventors made a presumption that although driving voltage tends to be higher as the thickness of the hole injection layer increases, the rate of increase in the driving voltage may be lower in a range where the thickness of the hole injection layer is relatively thin.

Accordingly, the inventors conducted further experiments on a hole injection layer formed from tungsten oxide under a predetermined condition. The thicknesses of the hole injection layer were set within the range of 5 nm to 40 nm, each thickness differing by 5 nm from the most similar thickness thereto. Details of the experiments and results thereof are described later with use of FIGS. 4A and 4B.

As the results of the experiments, the inventors found that, within the above range of 5 nm to 40 nm, the driving voltage for obtaining a predetermined current density is nearly constant regardless of the thickness of the hole injection layer (see experiment 1 of FIG. 1).

In other words, driving voltage satisfying a predetermined light-emitting efficiency is highly dependent on the thickness of each of the organic light-emitting layer and the hole transport layer. In contrast, regarding the hole injection layer made of tungsten oxide and having a thin layer structure, the driving voltage satisfying the predetermined light-emitting efficiency has low dependency on the thickness of the hole injection layer is low.

After conducting the experiments and studies and gaining new insights as described above, the inventors realized the structure of an organic EL panel according to one aspect of the present invention.

Furthermore, after gaining the insights, the inventors conducted: an experiment of changing the thickness of the organic light-emitting layer to adjust light-extraction efficiency; and an experiment of changing the thickness of the hole injection layer to adjust light-extraction efficiency. As a result, the inventors found that the light-extraction efficiency did not differ greatly regardless of whether the thickness of the organic light-emitting layer was changed or the thickness of the hole injection layer was changed.

Based on the above findings, the inventors made optical correction on the hole injection layer made of tungsten oxide, instead of on the organic light-emitting layer or the hole transport layer, and arrived at an organic EL panel, according to an aspect of the present invention, that satisfies excellent optical characteristics and reduces driving voltage.

DESCRIPTION OF EMBODIMENTS

One aspect of the present invention is an organic EL panel comprising: a plurality of anodes that are disposed in one-to-one correspondence with R (red), G (green), and B (blue) colors and reflect light; a cathode that is disposed to face the anodes and transmits light therethrough; a plurality of organic light-emitting layers that are disposed between the anodes and the cathode, correspond one-to-one with the R, G, and B colors, and each emit light of the corresponding color due to voltage application between the anodes and the cathode; and a plurality of first functional layers that are disposed between the anodes and the organic light-emitting layers, correspond one-to-one with the R, G, and B colors, and are each constituted of at least two layers including a hole injection layer for injecting holes and a hole transport layer provided on the hole injection layer and for transporting the holes to the organic light-emitting layer of the corresponding color, wherein a first portion of light of each of the R, G, and B colors emitted from the organic light-emitting layer of the corresponding color travels through the first functional layer of the corresponding color toward the anode of the corresponding color, strikes and is reflected by the anode, and then emitted externally after passing through the first functional layer of the corresponding color, the organic light-emitting layer of the corresponding color, and the cathode, and a second portion of the light of each of the R, G, and B colors travels toward the cathode instead of toward the anode of the corresponding color, and is emitted externally after passing through the cathode, the hole injection layer of each of the R, G, and B colors is made of only a metal oxide including tungsten oxide, and has a thickness of 5 nm to 40 nm, at least one of the hole injection layers having a thickness different from the other hole injection layers, the hole transport layers of the R, G, and B colors are equivalent in thickness, and the organic light-emitting layers of the R, G, and B colors are equivalent in thickness.

In the organic EL panel according to the above aspect of the present invention, the hole transport layers of the R, G, and B colors are equivalent in thickness; the organic light-emitting layers of the R, G, and B colors are also equivalent in thickness; and adjustment is made in the thickness of each of the hole injection layers of the R, G, and B colors. The hole injection layers of the R, G, and B colors are made of only a metal oxide including tungsten oxide, and each have a thickness of 5 nm to 40 nm.

This makes it possible to cause the driving voltage for obtaining a predetermined current density to be nearly constant, preventing an increase in the driving voltage due to an increase in film thickness. Even if one of the hole injection layers of the R, G, and B colors is thicker than the others as a result of film thickness adjustment, the driving voltage at the thicker hole injection layer is nearly equal to the thinner hole injection layers. This allows for reduction in driving voltage in the organic EL panel as a whole.

As another aspect of the present invention, tungsten in the tungsten oxide may include both tungsten with a valence of six, which is a maximum valence thereof, and tungsten with a valence of five, which is lower than the maximum valence, and the hole injection layers may each include a crystal of the tungsten oxide, the crystal having a particle diameter on an order of nanometers.

In the organic EL panel of the above aspect, tungsten in the tungsten oxide includes both tungsten with a valence of six, which is the maximum valence thereof, and tungsten with a valence of five, which is lower than the maximum valence. This allows the hole injection layers to have oxygen vacancies or similar structures. Additionally, setting the particle diameter of the tungsten oxide crystal to be on the order of nanometers allows for the formation, in the hole injection layers, of numerous crystal interfaces that include many structures similar to oxygen vacancies. As a result, conduction paths for holes extend through each hole injection layer in the direction of thickness thereof, allowing for effective hole conduction at a low driving voltage.

As another aspect of the present invention, a ratio $W^{5+}/W^{6+}$ of the number of atoms of the tungsten with a valence of five to the number of atoms of the tungsten with a valence of six may be at least 3.2%.

In the organic EL panel of the above aspect, tungsten with a valence of five is included at a ratio of at least 3.2% with respect to tungsten with a valence of six. This achieves even better hole conduction efficiency.

As another aspect of the present invention, the tungsten with a valence of five may cause a band structure of the hole injection layers to have an occupied energy level in a range between 1.8 electron volts and 3.6 electron volts lower than a lowest energy level of a valence band in terms of binding energy.

In the organic EL panel according to the above aspect, due to the existence of the above occupied energy level, the hole injection barrier between the hole injection layers and the hole transport layers is reduced. This achieves even better hole injection efficiency.

As another aspect of the present invention, the hole injection layers may each include a plurality of crystals of the tungsten oxide, each of the crystals having a particle diameter of 3 nm to 10 nm.

As another aspect of the present invention, the first functional layer of each of the R, G, and B colors may have a thickness of 36 nm to 69 nm, and an optical distance between the organic light-emitting layer of each of the R, G, and B colors and the anode of each of the R, G, and B colors may be 72 nm to 131 nm.

The inventors of the present invention found that light-extraction efficiency obtained by adjusting the thickness of each of the hole injection layers does not differ greatly from light-extraction efficiency obtained by adjusting the thickness of each of the organic light-emitting layers, provided that the first functional layers each have a thickness of 36 nm to 69 nm, and that the optical distance between the organic light-emitting layers and the anodes is 72 nm to 131 nm.

In the organic EL panel according to one aspect of the present invention, the first functional layer of each of the R, G, and B colors may have a thickness of 36 nm to 69 nm, and an optical distance between the organic light-emitting layer of each of the R, G, and B colors and the anode of each of the R, G, and B colors may be 72 nm to 131 nm.

This achieves light-extraction efficiency equivalent to that obtained by adjusting the thickness of the organic light-emitting layers.

As described above, the organic EL panel according to one aspect of the present invention realizes light-extraction efficiency equivalent to that obtained by adjusting the thickness of the organic light-emitting layers while reducing the driving voltage.

Furthermore, the organic EL panel according to the above aspect of the present invention realizes chromaticity equivalent to that obtained by adjusting the thickness of the organic light-emitting layers.

As another aspect of the present invention, the hole injection layers of the R, G, and B colors may each have a different thickness.

As another aspect of the present invention, the hole injection layers may be made of only tungsten oxide.

The inventors of the present invention found that, when the following conditions are satisfied: (i) the hole injection layers are made of only tungsten oxide; and (ii) the thicknesses of the respective hole injection layers are set within the range of 5 nm to 40 nm, each thickness differing by 5 nm from the most similar thickness thereto, then the driving voltage for obtaining a predetermined current density is nearly constant regardless of the thickness of each of the hole injection layers.

In the organic EL panel of the above aspect, the hole injection layers are made of only tungsten oxide. This makes it possible to cause the driving voltage for obtaining a predetermined current density to be nearly constant.

As another aspect of the present invention, the hole injection layer of the R color may have a thickness of 36 nm to 40 nm, the hole injection layer of the G color may have a thickness of 30 nm to 34 nm, the hole injection layer of the B color may have a thickness of 8 nm to 12 nm, the hole transport layers of the R, G, and B colors may have the same thickness within a range between 7 nm and 13 nm, and the organic light-emitting layers of the R, G, and B colors may have the same thickness within a range between 32 nm and 48 nm.

As another aspect of the present invention, the hole injection layer of the R color may have a thickness of 36 nm to 40 nm, the hole injection layer of the G color may have a thickness of 26 nm to 30 nm, the hole injection layer of the B color may have a thickness of 4 nm to 8 nm, the hole transport layers of the R, G, and B colors may have the same thickness within a range between 12 nm and 18 nm, and the organic light-emitting layers of the R, G, and B colors may have the same thickness within a range between 32 nm and 48 nm.

The organic EL panel as one aspect of the present invention may further comprise a plurality of second functional layers that are disposed between the organic light-emitting layers and the cathode, and correspond one-to-one with the R, G, and B colors, wherein each of the first functional layers of the R, G, and B colors may include a transparent conductive layer formed on the anode of the corresponding color, the transparent conductive layers of the R, G, and B colors may be equivalent in thickness, and the second functional layers of the R, G, and B colors may each include an electron injection transporting layer, the electron injection transporting layers of the R, G, and B colors being equivalent in thickness.

One aspect of the present invention is an organic EL panel comprising: a plurality of anodes that are disposed in one-to-one correspondence with R (red), G (green), and B (blue) colors and reflect light; a cathode that is disposed to face the anodes and transmits light therethrough; a plurality of organic light-emitting layers that are disposed between the anodes and the cathode, correspond one-to-one with the R, G, and B colors, and each emit light of the corresponding color due to voltage application between the anodes and the cathode; and a plurality of first functional layers that are disposed between the anodes and the organic light-emitting layers, correspond one-to-one with the R, G, and B colors, and are each constituted of at least two layers including a hole injection layer for injecting holes and a hole transport layer provided on the hole injection layer and for transporting the holes to the organic light-emitting layer of the corresponding color, wherein a first portion of light of each of the R, G, and B colors emitted from the organic light-emitting layer of the corresponding color travels through the first functional layer of the corresponding color toward the anode of the corresponding color, strikes and is reflected by the anode, and then emitted externally after passing through the first functional layer of the corresponding color, the organic light-emitting layer of the corresponding color, and the cathode, and a second portion of the light of each of the R, G, and B colors travels toward the cathode instead of toward the anode of the corresponding color, and is emitted externally after passing through the cathode, the hole injection layer of each of the R, G, and B colors is made of only a metal oxide including tungsten oxide, the hole injection layer of the R color having a thickness of 36 nm to 40 nm, the hole injection layer of the G color having a thickness of 30 nm to 34 nm, and the hole injection layer of the B color having a thickness of 8 nm to 12 nm, the hole transport layers of the R, G, and B colors each have a thickness of 7 nm to 13 nm, and the organic light-emitting layers of the R, G, and B colors each have a thickness of 32 nm to 48 nm.

In the organic EL panel of the above aspect, the driving voltage for obtaining a predetermined current density can be nearly constant. This prevents an increase in the driving voltage due to an increase in film thickness.

In the organic EL panel as one aspect of the present invention, the first functional layer of each of the R, G, and B colors may have a thickness of 36 nm to 69 nm, and an optical distance between the organic light-emitting layer of each of the R, G, and B colors and the anode of each of the R, G, and B colors may be 72 nm to 131 nm.

The organic EL panel of the above aspect achieves light-extraction efficiency equivalent to that obtained by adjusting the thickness of the organic light-emitting layers.

Accordingly, the organic EL panel realizes light-extraction efficiency equivalent to that obtained by adjusting the thickness of the organic light-emitting layers while reducing the driving voltage.

One aspect of the present invention is an organic EL panel comprising: a plurality of anodes that are disposed in one-to-one correspondence with R (red), G (green), and B (blue) colors and reflect light; a cathode that is disposed to face the anodes and transmits light therethrough; a plurality of organic light-emitting layers that are disposed between the anodes and the cathode, correspond one-to-one with the R, G, and B colors, and each emit light of the corresponding color due to voltage application between the anodes and the cathode; and a plurality of first functional layers that are disposed between the anodes and the organic light-emitting layers, correspond one-to-one with the R, G, and B colors, and are each constituted of at least two layers including a hole injection layer for injecting holes and a hole transport layer provided on the hole injection layer and for transporting the holes to the organic light-emitting layer of the corresponding color, wherein a first portion of light of each of the R, G, and B colors emitted from the organic light-emitting layer of the corresponding color travels through the first functional layer of the corresponding color toward the anode of the corresponding color, strikes and is reflected by the anode, and then emitted externally after passing through the first functional layer of the corresponding color, the organic light-emitting layer of the corresponding color, and the cathode, and a second portion of the light of each of the R, G, and B colors travels toward the cathode instead of toward the anode of the corresponding color, and is emitted externally after passing through the cathode, the hole injection layer of each of the R, G, and B colors is made of only a metal oxide including tungsten oxide, the hole injection layer of the R color having a thickness of 36 nm to 40 nm, the hole injection layer of the G color having a thickness of 26 nm to 30 nm, and the hole injection layer of the B color having a thickness of 4 nm to 8 nm, the hole transport layers of the R, G, and B colors each have a thickness of 12 nm to 18 nm, and the organic light-emitting layers of the R, G, and B colors each have a thickness of 32 nm to 48 nm.

In the organic EL panel of the above aspect, the driving voltage for obtaining a predetermined current density can be nearly constant. This prevents an increase in the driving voltage due to an increase in film thickness.

In the organic EL panel as one aspect of the present invention, the first functional layer of each of the R, G, and B colors may have a thickness of 36 nm to 69 nm, and an optical distance between the organic light-emitting layer of each of the R, G, and B colors and the anode of each of the R, G, and B colors may be 72 nm to 131 nm.

The organic EL panel of the above aspect achieves light-extraction efficiency equivalent to that obtained by adjusting the thickness of the organic light-emitting layers.

Accordingly, the organic EL panel realizes light-extraction efficiency equivalent to that obtained by adjusting the thickness of the organic light-emitting layers while reducing the driving voltage.

One aspect of the present invention is a manufacturing method of an organic EL panel, comprising: a first step of disposing a plurality of anodes that reflect light so as to correspond one-to-one with R (red), G (green), and B (blue) colors; a second step of disposing a plurality of first functional layers over the anodes so as to correspond one-to-one with the R, G, and B colors, each of the first functional layers being constituted of at least two layers including a hole injection layer for injecting holes and a hole transport layer for transporting the holes; a third step of disposing a plurality of organic light-emitting layers over the first functional layers so as to correspond one-to-one with the R, G, and B colors, each of the organic light-emitting layers emitting light of the corresponding color; and a fourth step of disposing a cathode over the organic light-emitting layers so as to face the anodes, the cathode transmitting light, wherein in the second step, the hole injection layers are formed such that: the hole injection layers are formed from only a metal oxide including tungsten oxide, and each have a thickness of 5 nm to 40 nm; and at least one of the hole injection layers has a thickness different from the other hole injection layers, and in the third step, the organic light-emitting layers are formed to be equivalent in thickness.

As another aspect of the present invention, in the second step, the hole transport layers of the R, G, and B colors may be formed to be equivalent in thickness, and the first functional layers may be formed such that: the first functional layers have a thickness of 36 nm to 69 nm; and an optical distance between the organic light-emitting layer of each of the R, G, and B colors and the anode of each of the R, G, and B colors is 72 nm to 131 nm.

As another aspect of the present invention, in the second step, the hole injection layers may be formed by applying the tungsten oxide to the anodes using a vapor deposition method or a sputtering method, the hole transport layers may be formed by applying ink to the hole injection layers using a printing method or an inkjet method, the ink including a hole transport material, and in the third step, the organic light-emitting layers may be formed by applying ink to the hole transport layer using the printing method or the inkjet method, the ink including an organic light-emitting material.

As another aspect of the present invention, forming of the hole injection layers in the second step may include: a formation step of forming, on the anodes, a tungsten oxide layer including the tungsten oxide, a lamination step of laminating a photoresist layer including a photoresist material on the tungsten oxide layer, an adjustment step of adjusting a thickness of the photoresist layer, such that the thickness differs at each of portions of the photoresist layer corresponding to the R, G, and B colors, by selectively exposing the photoresist layer to light with use of a mask having a light transmittance that differs at each of portions of the mask corresponding to the R, G, and B colors, a shaping step of shaping the tungsten oxide layer so that portions thereof corresponding to the R, G, and B colors each have a different thickness, by (i) etching, with use of a developing solution, the photoresist layer whose thickness has been adjusted and (ii) removing portions of the tungsten oxide layer, including a top thereof, with use of the developing solution; and a removal step of removing the photoresist layer from the tungsten oxide layer after the shaping step.

As another aspect of the present invention, the manufacturing method may further comprise another step between the third step and the fourth step, said another step being of disposing a plurality of second functional layers on the organic light-emitting layers so as to correspond one-to-one with the R, G, and B colors, wherein in the second step, each of the first functional layers of the R, G, and B colors may be formed to further include a transparent conductive layer, each of the transparent conductive layers of the R, G, and B colors being formed on the anode of the corresponding color and being equivalent in thickness, and in said another step, each of the second functional layers of the R, G, and B colors may be formed to include an electron injection transporting layer, the electron injection transporting layers of the R, G, and B colors being equivalent in thickness.

As another aspect of the present invention, in the second step, the hole injection layers may be formed with a sputtering gas including argon gas and oxygen gas, using tungsten as a sputtering target, under film forming conditions such that a total pressure of the sputtering gas is 2.3 Pa to 7.0 Pa, a partial pressure of the oxygen gas in the sputtering gas is 50% to 70%, an input power density per unit area of the sputtering target is 1.5 W/cm$^2$ to 6.0 W/cm$^2$, and a value yielded by dividing the total pressure of the sputtering gas by the input power density is larger than 0.7 Pa·cm$^2$/W.

As another aspect of the present invention, in the second step, the hole injection layers may be formed so that tungsten in the tungsten oxide includes both tungsten with a valence of six, which is a maximum valence thereof, and tungsten with a valence of five, which is lower than the maximum valence, and so as to include a tungsten oxide crystal having a particle diameter on an order of nanometers.

As another aspect of the present invention, in the second step, the value yielded by dividing the total pressure of the sputtering gas by the input power density may be less than 3.2 Pa·cm$^2$/W.

Another aspect of the present invention may be an organic light-emitting device using an organic EL panel manufactured by the manufacturing method according to the above aspect of the present invention.

The organic light-emitting device of the above aspect includes the organic EL panel which is manufactured by the manufacturing method according to the above aspect of the present invention. This organic light-emitting device reduces driving voltage for the reasons given above.

Another aspect of the present invention may be an organic display device using an organic EL panel manufactured by the manufacturing method according to the above aspect of the present invention.

The organic display device of the above aspect includes the organic EL panel which is manufactured by the manufacturing method according to the above aspect of the present invention. This organic display device reduces driving voltage for the reasons given above.

EMBODIMENT

General Outline

In an organic EL panel according to the present embodiment, the thickness of a hole injection layer is set for each of R, G, and B colors within a thin film range of 5 nm to 40 nm, whereby light-extraction efficiency is adjusted. First, a description is provided of an advantage of adjusting light-extraction efficiency by changing the thickness of the hole injection layer, instead of changing the thickness of an organic light-emitting layer or a hole transport layer for each of R, G, and B colors. Then, a description is provided of: a simulation in which light-extraction efficiency is adjusted by changing the thickness of the hole injection layer for each of R, G, and B colors; and a simulation in which light-extraction efficiency is adjusted by changing the thickness of the organic light-emitting layer for each of R, G, and B colors. Finally, a detailed description is provided of the structure of the organic EL panel according to the present embodiment.

<Relationship Between Driving Voltage and Thicknesses of Organic Light-Emitting Layer and Hole Transport Layer>

The following describes how current density and driving voltage change when the thickness of the organic light-emitting layer and the thickness of the hole transport layer are changed.

Figures 2A, 2B:
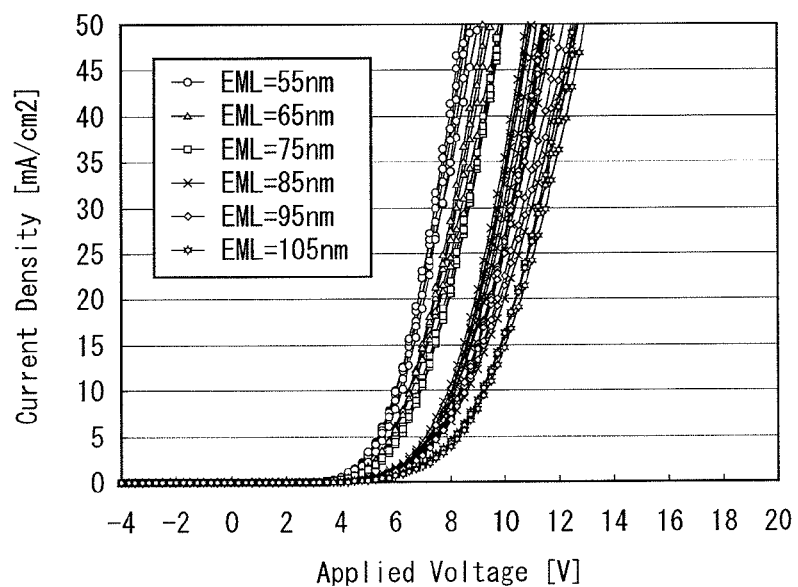
FIG. 2A shows the relationship between current density and driving voltage for each of the thicknesses of an organic light-emitting layer. The thicknesses of the organic light-emitting layer are set within the range of 55 nm to 105 nm, each thickness differing by 10 nm from the most similar thickness thereto.
FIG. 2B shows the relationship between each of the thicknesses of the organic light-emitting layer and driving voltage, when the current density is 10 mA/cm$^2$.

FIG. 2A shows the relationship between current density and driving voltage for each of the thicknesses of the organic light-emitting layer. The thicknesses of the organic light-emitting layer are set within the range of 55 nm to 105 nm, each thickness differing by 10 nm from the most similar thickness thereto. As shown in FIG. 2A, the larger the thickness of the organic light-emitting layer, the larger the driving voltage necessary to obtain a predetermined current density. Also, as compared to the case where the thickness of the hole injection layer is changed as described below (see FIG. 4A), variations in the driving voltage are large among the thicknesses of the organic light-emitting layer.

FIG. 2B shows the relationship between each of the thicknesses of the organic light-emitting layer and the driving voltage, when the current density is 10 mA/cm$^2$. As shown in FIG. 2B, the larger the thickness of the organic light-emitting layer, the larger the driving voltage. Also, the variations in the driving voltage are large among the thicknesses. For example, the difference in driving voltage between the thicknesses is 3.4 V at a maximum (between a thickness of 55 nm and a thickness of 105 nm).

As such, when light-extraction efficiency is adjusted by changing the thickness of the organic light-emitting layer for each of the R, G, and B colors, the driving voltage for a thicker portion of the organic light-emitting layer becomes large. This hinders reduction in power consumption.

Figures 3A, 3B:
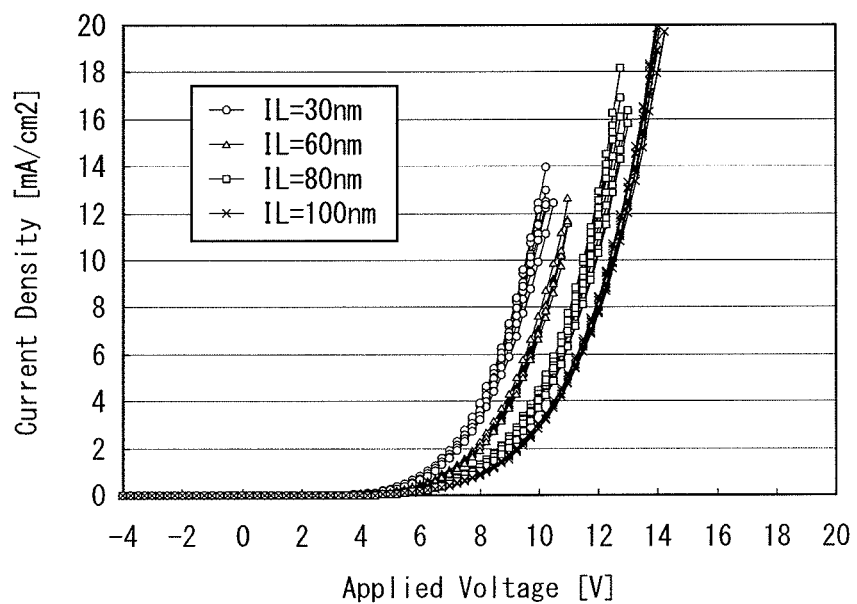
FIG. 3A shows the relationship between current density and driving voltage for each of the thicknesses of a hole transport layer. The thicknesses of the hole transport layer are set to 30 nm, 60 nm, 80 nm, and 100 nm.
FIG. 3B shows the relationship between each of the thicknesses of the hole transport layer and driving voltage, when the current density is 10 mA/cm².

FIG. 3A shows the relationship between current density and driving voltage for each of the thicknesses of the hole transport layer. The thicknesses of the hole transport layer are set to 30 nm, 60 nm, 80 nm, and 100 nm. As shown in FIG. 3A, the larger the thickness of the hole transport layer, the larger the driving voltage necessary to obtain a predetermined current density, similarly to the case of the organic light-emitting layer. Also, as compared to the case where the thickness of the hole injection layer is changed, variations in the driving voltage are large among the thicknesses of the hole transport layer.

FIG. 3B shows the relationship between each of the thicknesses of the hole transport layer and the driving voltage, when the current density is 10 mA/cm$^2$. As shown in FIG. 3B, the larger the thickness of the hole transport layer, the larger the driving voltage. Also, the variations in the driving voltage are large among the thicknesses. For example, the difference in driving voltage between the thicknesses is 2.7 V at a maximum (between a thickness of 30 nm and a thickness of 100 nm).

As compared to the case where light-extraction efficiency is adjusted by changing the thickness of the organic light-emitting layer, the rate of increase in the driving voltage is smaller when the thickness of the hole transport layer is increased. However, the driving voltage still does increase along with an increase in the thickness of the hole transport layer.

<Relationship between Thickness of Hole Injection Layer and Driving Voltage>

Figures 4A, 4B:
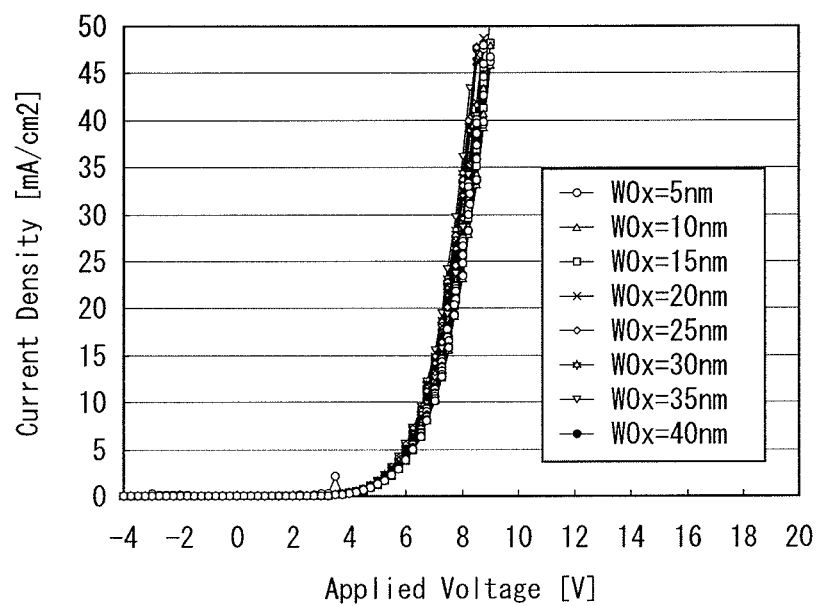
FIG. 4A shows the relationship between current density and driving voltage for each of the thicknesses of the hole injection layer. The thicknesses of the hole injection layer are set within the range of 5 nm to 40 nm, each thickness differing by 5 nm from the most similar thickness thereto.
FIG. 4B shows the relationship between each of the thicknesses of the hole injection layer and driving voltage, when the current density is 10 mA/cm².

The following describes how current density and driving voltage change when the thickness of the hole injection layer is changed within a range where the thickness of the hole injection layer is relatively thin. FIG. 4A shows the relationship between current density and driving voltage for each of the thicknesses of the hole injection layer. The thicknesses of the hole injection layer are set within the range of 5 nm to 40 nm, each thickness differing by 5 nm from the most similar thickness thereto. As shown in FIG. 4A, variations in the driving voltage are clearly small among the thicknesses of the hole injection layer, as compared to the cases where the thickness of the organic light-emitting layer or the hole transport layer is changed.

FIG. 4B shows the relationship between each of the thicknesses of the hole injection layer and the driving voltage, when the current density is 10 mA/cm$^2$. As shown in FIG. 4B, within the range where the thickness of the hole injection layer is 5 nm to 40 nm, the driving voltage is either 6.7 V or 6.8 V, and variations in the driving voltage are small.

In other words, when light-extraction efficiency is adjusted by changing the thickness of the hole injection layer for each of the R, G, and B colors within the range of 5 nm to 40 nm, an increase in the driving voltage due to an increase in film thickness is suppressed. This allows reduction in power consumption.

The reason why variations in the driving voltage are small as described above is considered as follows. The hole injection layer is composed of metal oxide. Owing to this, the hole injection layer is highly conductive as compared to the organic light-emitting layer and the hole transport layer which are composed of organic material.

The reason why variations in the driving voltage are small within the range where the thickness of the hole injection layer is 5 nm to 40 nm is considered as follows, although it is not perfectly clear at present. The following only provides a brief description, and details are provided later.

According to the present embodiment, the hole injection layer is composed of a thin tungsten oxide layer (the thickness thereof being 5 nm to 40 nm). Tungsten in the tungsten oxide includes both tungsten with a valence of six, which is the maximum valence thereof, and tungsten with a valence of five, which is lower than the maximum valence. This allows the hole injection layer to include a hole conducting portion. In addition, the tungsten oxide layer includes a crystal of the tungsten oxide, and the crystal has a particle diameter on the order of nanometers. This increases the number of crystal interfaces, causing overlaps of electron orbitals that contribute to hole conduction. This results in improvement in the electrical conductivity within the hole injection layer. Accordingly, the driving voltage becomes small and stabilized.

<First Simulation>

The following describes: a simulation in which light-extraction efficiency is adjusted by changing the thickness of the hole injection layer for each of R, G, and B colors; and a simulation in which light-extraction efficiency is adjusted by changing the thickness of the organic light-emitting layer for each of R, G, and B colors. FIG. 5A shows conditions and results of simulations in which light-extraction efficiency is adjusted by changing the thickness of the hole injection layer for each of R, G, and B colors (Examples 1-1 and 1-2), and where light-extraction efficiency is adjusted by changing the thickness of the organic light-emitting layer for each of R, G, and B colors (Comparative example 1). Note that in the simulation shown in FIG. 5A, electric current efficiency (hereinafter "current efficiency") is used as light-extraction efficiency. FIG. 5B shows the refractive index of each of the hole transport layer, the hole injection layer, and the transparent conductive layer.

—Thickness of Each Layer in Comparative Example 1 and Example 1-1—

In Comparative example 1 of FIG. 5A, light-extraction efficiency is adjusted by changing the thickness of the organic light-emitting layer for each of the R, G, and B colors. Specifically, the thickness of the organic light-emitting layer for the R color is set to 80 nm, the thickness thereof for the G color to 80 nm, and the thickness thereof for the B color to 50 nm. The electron transport layer, the hole transport layer, the hole injection layer, and the transparent conductive layer each have the same thickness regardless of the R, G, and B colors.

In Example 1-1 of FIG. 5A, light-extraction efficiency is adjusted by changing the thickness of the hole injection layer for each of the R, G, and B colors. Specifically, the thickness of the hole injection layer for the R color is set to 38 nm, the thickness thereof for the G color to 32 nm, and the thickness thereof for the B color to 10 nm. The electron transport layer, the hole transport layer, and the transparent conductive layer each have the same thickness as in Comparative example 1. The organic light-emitting layer in Example 1-1 has the same thickness regardless of the R, G, and B colors, and is set to be thinner than the organic light-emitting layer of Comparative example 1 which has a thickness of 80 nm. Specifically, the organic light-emitting layer of Example 1-1 has a thickness of 40 nm, which is considered to ensure device performance based on a result of a preliminary experiment.

—Comparison between Comparative example 1 and Example 1-1—

The following describes current efficiency, chromaticity, driving voltage, power consumption, and total power consumption, with reference to Comparative example 1 in comparison with Example 1-1.

Concerning the current efficiency in terms of the R color, Comparative example 1 exhibits 7.9 cd/A, whereas Example 1-1 exhibits 9.3 cd/A, which is an improvement of approximately 18%. In terms of the G color, Comparative example 1 exhibits 41 cd/A, whereas Example 1-1 exhibits 40 cd/A, which is a degradation of approximately 4%. In terms of the B color, there is no difference between Comparative example 1 and Example 1-1.

Concerning the current efficiency, the Example 1-1 exhibits a great improvement of approximately 18% in terms of the R color, and a small degradation of approximately 4% in terms of the G color. Hence, it can be said that the current efficiency is improved as a whole.

Concerning chromaticity, Comparative example 1 and Example 1-1 both exhibit the same values in terms of the R and B colors. In terms of the G color, Comparative example 1 exhibits (0.28, 0.66), whereas Example 1-1 exhibits (0.29, 0.66). As can be seen, the value of x in Example 1-1 is larger by 0.01 than that in Comparative example 1. According to EBU standard, for example, the chromaticity of the G color is defined as (0.29, 0.60). Based on the EBU standard, Example 1-1 exhibits an improved chromaticity in terms of the G color.

In view of the above points, it can be known that the current efficiency and the chromaticity do not differ greatly regardless of whether the thickness of the organic light-emitting layer was changed for each of the R, G, and B colors or the thickness of the hole injection layer was changed for each of the R, G, and B colors. Rather, the current efficiency and the chromaticity are slightly more improved in the latter case.

Concerning the driving voltage, Example 1-1 exhibits great improvement as compared to Comparative example 1. Specifically, in Comparative example 1, the driving voltage is 6.1 V in the R color, 8.2 V in the G color, and 6.2 V in the B color, whereas in Example 1-1, the driving voltage is 4.4 V in the R color, 4.9 V in the G color, and 5.4 V in the B color. As can be seen, in Example 1-1, the driving voltage is lowered by approximately 28% in the R color, approximately 40% in the G color, and approximately 13% in the B color.

Accordingly, Example 1-1 also exhibits improvement concerning power consumption, as compared to Comparative example 1. Concerning total power consumption, Comparative example 1 exhibits 27.11 W, whereas Example 1-1 exhibits 21.77 W, which is lower than in Comparative example 1 by approximately 20%.

In conclusion, it can be said that when light-extraction efficiency is adjusted by changing the thickness of the hole injection layer for each of the R, G, and B colors, the current efficiency and chromaticity are either maintained or slightly improved and the driving voltage is reduced, as compared to the case where light-extraction efficiency is adjusted by changing the thickness of the organic light-emitting layer for each of the R, G, and B colors.

—Thickness of Each Layer in Example 1-2—

Example 1-2 of FIG. 5A is another example in which light-extraction efficiency is adjusted by changing the thickness of the hole injection layer for each of the R, G, and B colors. In Example 1-2, the thickness of the hole injection layer for the R color is set to 38 nm, the thickness thereof for the G color to 28 nm, and the thickness thereof for the B color to 6 nm. Also, the thickness of each of the electron transport layer and the hole transport layer is 5 nm thicker than those in Example 1-1.

—Comparison between Comparative example 1 and Example 1-2—

The following describes current efficiency, chromaticity, driving voltage, power consumption, and total power consumption, with reference to Comparative example 1 in comparison with Example 1-2.

Concerning the current efficiency in terms of the R color, Comparative example 1 exhibits 7.9 cd/A, whereas Example 1-2 exhibits 9.3 cd/A, which is an improvement of approximately 18%. In terms of the G color, Comparative example 1 exhibits 41 cd/A, whereas Example 1-2 exhibits 39 cd/A, which is a degradation of approximately 5%. In terms of the B color, there is no difference between Comparative example 1 and Example 1-2.

Concerning the current efficiency, the Example 1-2 exhibits a great improvement of approximately 18% in terms of the R color, and a small degradation of approximately 5% in terms of the G color. Hence, it can be said that the current efficiency is improved as a whole.

Concerning chromaticity, Comparative example 1 and Example 1-2 both exhibit the same values in terms of the R color. In terms of the G color, Comparative example 1 exhibits (0.28, 0.66), whereas Example 1-2 exhibits (0.29, 0.66). As can be seen, the value of x in Example 1-2 is larger by 0.01 than that in Comparative example 1. Accordingly, based on the same reason given above, Example 1-2 exhibits an improved chromaticity in terms of the G color. In terms of the B color, Comparative example 1 exhibits (0.13, 0.074), whereas Example 1-2 exhibits (0.13, 0.075). As can be seen, the value of y in Example 1-2 is larger by 0.001 than that in Comparative example 1. According to the EBU standard, for example, the chromaticity of the B color is defined as (0.15, 0.06). Accordingly, in teems of the B color, the chromaticity in Example 1-2 is more degraded.

Concerning the chromaticity, the Example 1-2 exhibits an improvement of approximately 4% in terms of the G color, and a degradation of approximately 1% in terms of the B color. Hence, it can be said that the chromaticity is improved as a whole.

In view of the above points, the following can be said for Example 1-2, similarly to Example 1-1. That is, the current efficiency and the chromaticity do not differ greatly regardless of whether the thickness of the organic light-emitting layer was changed for each of the R, G, and B colors or the thickness of the hole injection layer was changed for each of the R, G, and B colors. Rather, the current efficiency and the chromaticity are slightly more improved in the latter case.

Concerning the driving voltage, Example 1-2 exhibits great improvement as compared to Comparative example 1, similarly to the case of Example 1-1. Specifically, in Comparative example 1, the driving voltage is 6.1 V in the R color, 8.2 V in the G color, and 6.2 V in the B color, whereas in Example 1-2, the driving voltage is 4.6 V in the R color, 5.1 V in the G color, and 5.6 V in the B color. As can be seen, in Example 1-2, the driving voltage is lowered by approximately 25% in the R color, approximately 38% in the G color, and approximately 10% in the B color.

Accordingly, Example 1-2 also exhibits improvement concerning power consumption, as compared to Comparative example 1. Concerning total power consumption, Comparative example 1 exhibits 27.11 W, whereas Example 1-2 exhibits 22.15 W, which is lower than in Comparative example 1 by approximately 18%.

As described above, as compared to Example 1-1, a more difficult condition is imposed in Example 1-2 by setting the thickness of each of the electron transport layer and the hole transport layer to 5 nm thicker. Even so, the total power consumption is greatly improved in Example 1-2 as compared to Comparative example 1, although it is not as good as in Example 1-1.

—Thickness of First Functional Layer and Optical Distance—

Concerning the total thickness of the hole transport layer, the hole injection layer, and the transparent conductive layer (hereinafter, these layers are collectively referred to as "first functional layer"), the thinnest is 36 nm, which corresponds to the B color in Example 1-1, and the thickest is 69 nm, which corresponds to the R color in Example 1-2.

Concerning the optical distance between the anode and the organic light-emitting layer, the shortest is 72 nm, which corresponds to the B color in Example 1-1, and the longest is 131 nm, which corresponds to the R color in Example 1-2.

This means that under the conditions that: the thickness of the first functional layer is in the range of 36 nm to 69 nm; and the optical distance is in the range of 72 nm to 131 nm, the current efficiency and chromaticity can be either maintained or improved, and also the driving voltage can be lowered.

Note that the optical distance is the sum of the product of the film thickness and the refractive index for each layer. The refractive index for each layer used in the above calculation is as shown in FIG. 5B.

<Second Simulation>

The following describes: another simulation in which light-extraction efficiency is adjusted by changing the thickness of the hole injection layer for each of R, G, and B colors; and another simulation in which light-extraction efficiency is adjusted by changing the thickness of the organic light-emitting layer for each of R, G, and B colors. The following description assumes a 40-inch Full HD organic EL panel.

FIG. 6A shows conditions and results of simulations in which light-extraction efficiency is adjusted by changing the thickness of the hole injection layer for each of R, G, and B colors (Examples 2-1 and 2-2), and in which light-extraction efficiency is adjusted by changing the thickness of the organic light-emitting layer for each of R, G, and B colors (Comparative example 2).

The thickness of each layer in Comparative example 2, Example 2-1, and Example 2-2 is the same as in Comparative example 1, Example 1-1, and Example 1-2; therefore, a description thereof is omitted.

—Comparison between Comparative example 2 and Example 2-1—

The following describes current efficiency, chromaticity, driving voltage, power consumption, and total power consumption, with reference to Comparative example 2 in comparison with Example 2-1.

Comparison results between Comparative example 2 and Example 2-1 concerning the current efficiency, chromaticity, and driving voltage are the same as those between Comparative example 1 and Example 1-1. Accordingly, a description of the comparison results regarding these elements is omitted.

Example 2-1 exhibits improvement concerning power consumption, as compared to Comparative example 2. Concerning total power consumption, Comparative example 2 exhibits 101.00 W, whereas Example 2-1 exhibits 81.08 W, which is lower than in Comparative example 2 by approximately 20%.

Based on the above results, it can be said that when light-extraction efficiency is adjusted by changing the thickness of the hole injection layer for each of the R, G, and B colors, the current efficiency and chromaticity are either maintained or slightly improved and the driving voltage is reduced, as compared to the case where light-extraction efficiency is adjusted by changing the thickness of the organic light-emitting layer for each of the R, G, and B colors.

—Comparison between Comparative example 2 and Example 2-2—

The following describes current efficiency, chromaticity, driving voltage, power consumption, and total power consumption, with reference to Comparative example 2 in comparison with Example 2-2.

Comparison results between Comparative example 2 and Example 2-2 regarding the current efficiency, chromaticity, and driving voltage are basically the same as those between Comparative example 1 and Example 1-2. Accordingly, a description of the comparison results regarding these elements is omitted. Concerning the current efficiency in terms of the G color, Example 1-2 exhibits 39 cd/A, whereas Example 2-2 exhibits 40 cd/A. Concerning the chromaticity in terms of the B color, Example 1-2 exhibits (0.13, 0.075), whereas Example 2-2 exhibits (0.13, 0.074). However, since the thickness of each layer in Example 1-2 is the same as that of each layer in Example 2-2, the above difference in values is presumably caused due to variations.

Example 2-2 exhibits improvement concerning power consumption, as compared to Comparative example 2. Concerning total power consumption, Comparative example 2 exhibits 101.00 W, whereas Example 2-2 exhibits 82.50 W, which is lower than in Comparative example 2 by approximately 18%.

The thickness and optical distance of the first functional layer is as described above in the first simulation. In the present simulation as well, the refractive index used for each layer is as shown in FIG. 5B.

<Structure of Organic EL Panel>

Figure 7:
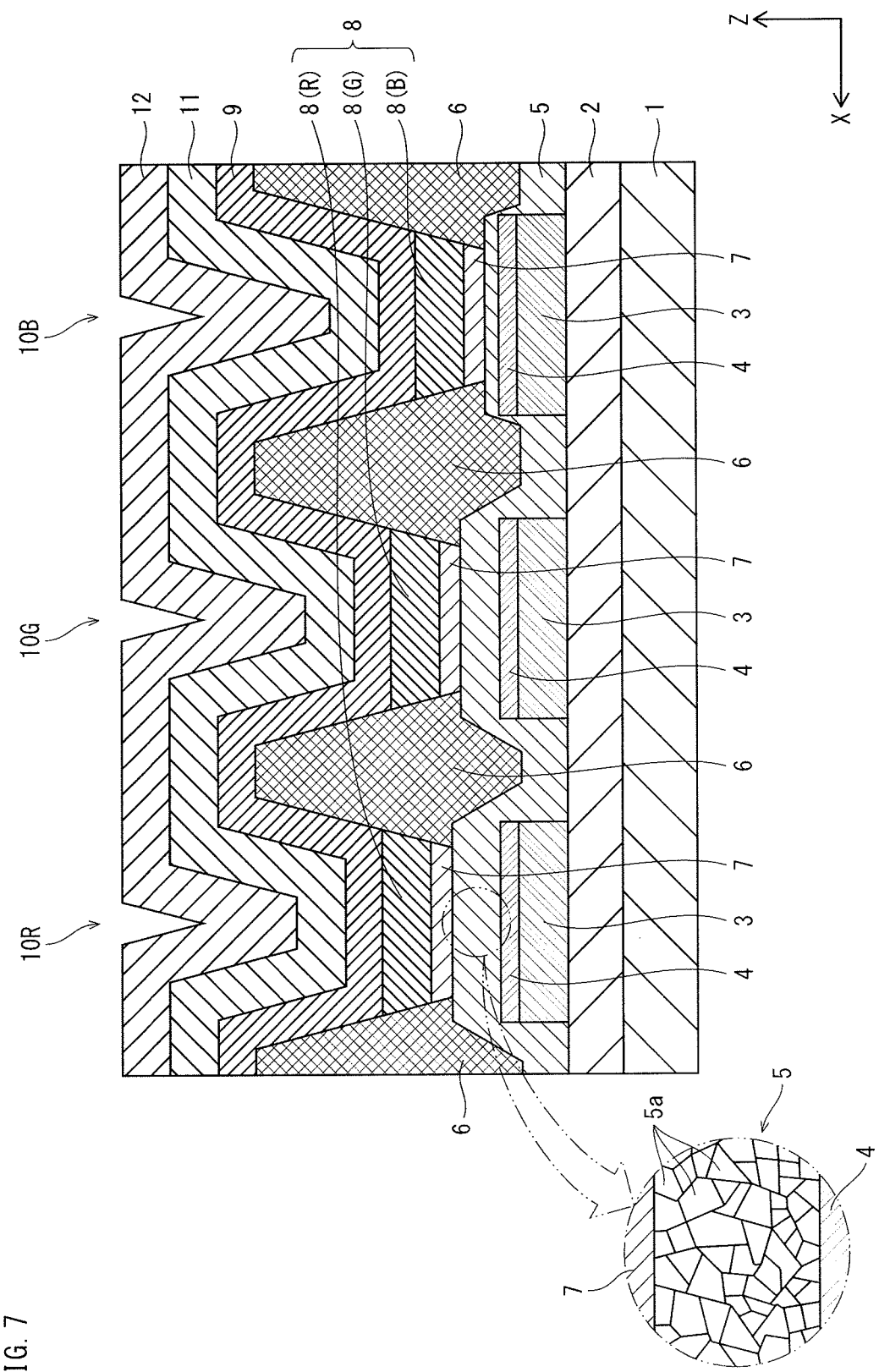
FIG. 7 is a cross-sectional view schematically showing the structure of an organic EL panel 10 according to an embodiment.
Figure 9A:
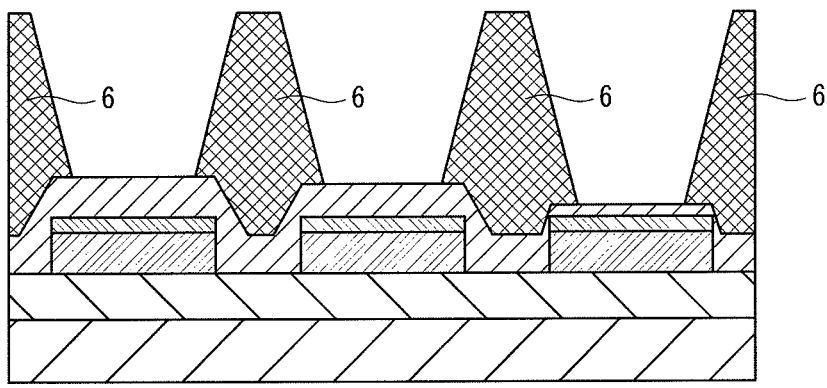
FIGS. 9A to 9C show an example of subsequent steps in the manufacturing process of the organic EL panel 10 according to the embodiment.
Figure 9B:
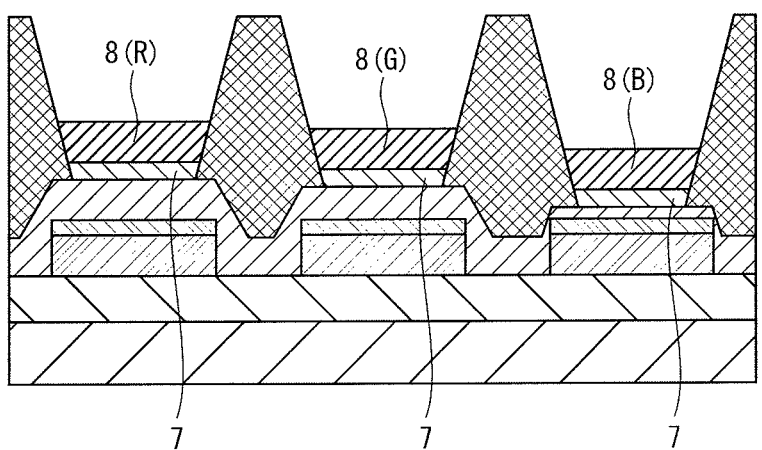
Figure 9C:
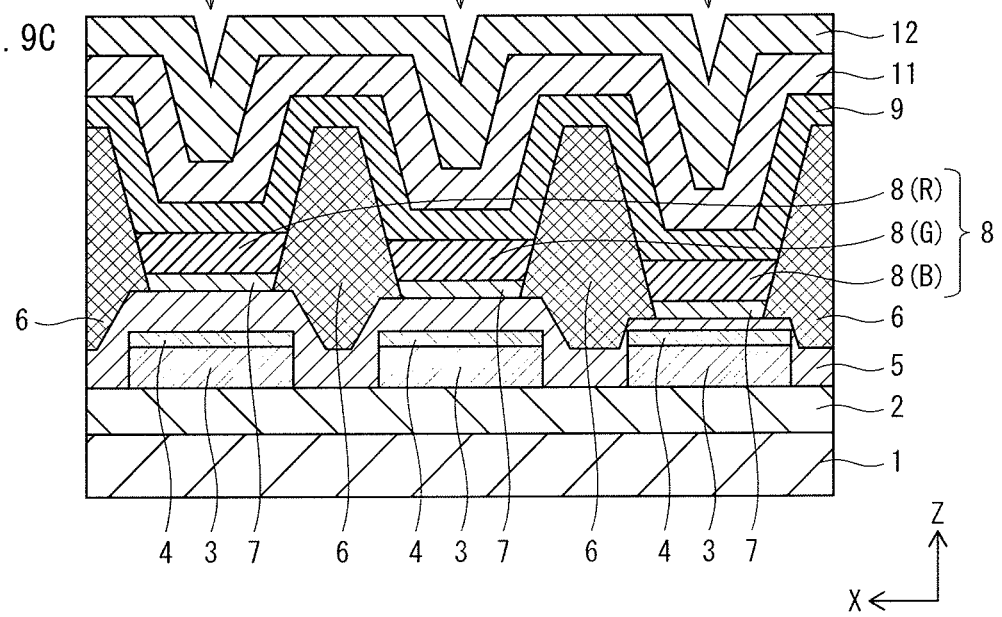

FIG. 7 is a cross-sectional view schematically showing the structure of an organic EL panel 10 according to the present embodiment. In the organic EL panel 10, subpixels 10R, 10G, and 10B of R (red), G (green), and B (blue) colors are arranged in rows and columns. The following describes in detail the structure of the organic EL panel 10.

As shown in FIG. 7, in the organic EL panel 10 according to the present embodiment, an interlayer insulation film 2 is formed on a TFT substrate 1, and anodes 3 are formed on the interlayer insulation film 2 by patterning. The anodes are formed in rows and columns in units of subpixels. Three subpixels 10R, 10G, and 10B which are adjacent in the X-axis direction constitute one pixel.

Transparent conductive layers 4 are formed on the respective anodes 3. Hole injection layers 5 are formed to cover the respective transparent conductive layers 4 above the interlayer insulation film 2. The hole injection layers 5 of the R, G, and B colors are different in thickness. As described in the above simulation, it is beneficial that the thickness of each of the hole injection layers 5 is 5 nm to 40 nm.

A bank 6 is formed in a region, on each of the hole injection layers 5, between the anodes 3. A hole transport layer 7 is formed above each anode 3, in a region defined by the banks 6, and an organic light-emitting layer 8 of a predetermined color is formed on each hole transport layer 7 (hereinafter, the transparent conductive layers 4, the hole injection layers 5, and the hole transport layers 7 disposed between the anodes 3 and the organic light-emitting layers 8 are collectively referred to as "first functional layers"). Note that the hole transport layers 7 of the R, G, and B colors are equivalent in thickness, and the organic light-emitting layers 8 of the R, G, and B colors are also equivalent in thickness. Equivalent in thickness as mentioned above also refers to the following cases: (i) the layers of the R, G, and B colors have the same designed value and the same measured value in the film thickness; and (ii) the layers of the R, G, and B colors have the same designed value but each have a different measured value within the range of manufacturing error (e.g., +5 nm per layer).

Furthermore, on the light-emitting layers 8, an electron transport layer 9, a cathode 11, and a passivation layer 12 are formed so as to extend over the regions defined by the banks 6 to be continuous between adjacent subpixels. The portions of the electron transport layer 9 corresponding to the R, G, and B colors are equivalent in thickness. As already described, the definition of "equivalent in thickness" includes the cases (i) and (ii) above.

The organic EL panel 10 realizes a cavity structure by means of the anodes 3. A first optical path and a second optical path are formed in the organic EL panel 10. The first optical path is travelled by a portion of light emitted from the organic light-emitting layers 8 that passes through the first functional layers toward the anodes 3, strikes and is reflected by the anodes 3, and then emitted externally after passing through the first functional layers, the organic light-emitting layers 8, and the cathode 11. The second optical path is travelled by a remaining portion of light emitted from the organic light-emitting layers 8 that travels toward the cathode instead of toward the anodes, and is emitted externally after passing through the cathode 11.

Light-extraction efficiency of the organic EL panel is increased by adjusting the distance between the organic light-emitting layers 8(R), 8(G), and 8(B) and the anodes 3 such that reflective light traveling the first optical path and direct light traveling the second optical path strengthen each other through the interference effect. The adjustment of the distance is realized by adjusting the thickness of the first functional layers.

Specifically, it is beneficial that the thickness of each of the first functional layers of the R, G, and B colors is 36 nm to 69 nm, as described in the above simulation.

In that case, it is beneficial that the hole injection layer 5 of the R color has a thickness of 36 nm to 40 nm, the hole injection layer 5 of the G color has a thickness of 30 nm to 34 nm, the hole injection layer of the B color has a thickness of 8 nm to 12 nm, that the hole transport layers 7 of the R, G, and B colors are equivalent in thickness within the range between 7 nm and 13 nm, and that the organic light-emitting layers 8 of the R, G, and B colors are equivalent in thickness within the range between 32 nm and 48 nm.

In particular, as described in Examples 1-1 and 2-1, it is more beneficial that the hole injection layer 5 of the R color has a thickness of 38 nm, the hole injection layer 5 of the G color has a thickness of 32 nm, the hole injection layer 5 of the B color has a thickness of 10 nm, that the hole transport layers 7 of the R, G, and B colors have the same thickness of 10 nm, and that the organic light-emitting layers 8 of the R, G, and B colors have the same thickness of 40 nm.

Alternatively, the hole injection layer 5 of the R color may have a thickness of 36 nm to 40 nm, the hole injection layer 5 of the G color may have a thickness of 26 nm to 30 nm, the hole injection layer of the B color may have a thickness of 4 nm to 8 nm, the hole transport layers 12 of the R, G, and B colors may be equivalent in thickness within the range between 12 nm and 18 nm, and the organic light-emitting layers 8 of the R, G, and B colors may be equivalent in thickness within the range between 32 nm and 48 nm.

Especially in this case, as described in Examples 1-2 and 2-2, it is more beneficial that the hole injection layer 5 of the R color has a thickness of 38 nm, the hole injection layer 5 of the G color has a thickness of 28 nm, the hole injection layer 5 of the B color has a thickness of 6 nm, that the hole transport layers 7 of the R, G, and B colors have the same thickness of 15 nm, and that the organic light-emitting layers 8 of the R, G, and B colors have the same thickness of 40 nm.

Also, it is beneficial that the optical distance between the organic light-emitting layers 8 of the R, G, and B colors and the anodes 3 is adjusted to 72 nm to 131 nm.

<Specific Examples of Each Layer>

The TFT substrate 1 is formed with a substrate body on which is formed a thin film transistor (TFT), a wiring member, and a passivation film (not shown) that covers the TFT. The substrate body is made of an insulating material such as alkali-free glass, soda glass, nonluminescent glass, phosphate glass, boric-acid glass, quartz, acrylic resin, styrene resin, polycarbonate resin, epoxy resin, polyethylene, polyester, silicone resin, and alumina. The substrate body may be an organic resin film.

The interlayer insulation film 2 is provided to planarize the uneven surface of the TFT substrate 1, and is made of an insulating material such as polyimide resin or acrylic resin.

The anode 3 is formed from aluminum (Al) or an aluminum alloy. The anode 3 may be formed from silver (Ag), an alloy of silver, palladium, and copper, an alloy of silver, rubidium, and gold, an alloy of molybdenum and chromium (MoCr), an alloy of nickel and chromium (NiCr), or the like. Since the organic EL panel 10 according to the present embodiment is a top emission type, it is beneficial that the anode 3 is formed from a light-reflective material.

The transparent conductive layer 4 functions as a protective layer to prevent the anode 3 from naturally oxidizing during the manufacturing process. The material for the transparent conductive layer 4 may be formed from a conductive material, such as ITO or IZO, that is sufficiently translucent with respect to light emitted by the organic light-emitting layer 8. In this way, the transparent conductive layer 4 achieves good conductivity even when they are formed at room temperature.

The hole injection layer 5 has the function of injecting holes into the organic light-emitting layer 8. For example, the hole injection layer 5 is formed only from metal oxide including an oxide of a transition metal, such as tungsten oxide (WOx), or molybdenum tungsten oxide (MoxWyOz). The hole injection layer 5 is formed without inclusion of any organic material and only from a metal oxide including an oxide of a transition metal, and the thickness of the hole injection layer 5 is 5 nm to 40 nm. This makes it possible to improve voltage-current density characteristics, and increase emission intensity by increasing current density.

It is more beneficial that the thickness of the hole injection layer 5 is larger than 10 nm and at most 40 nm. The reasons are as follows.

In the following, it is assumed that the hole injection layer 5 is formed from a tungsten oxide layer (WOx) having a thickness of 30 nm. In the composition formula WOx denoting the composition of the tungsten oxide, x is a real number existing within a range of approximately $2<x<3$. While it is desirable for the hole injection layer 5 to be formed only from tungsten oxide, the inclusion of a trace level of impurities is acceptable, provided that the amount does not exceed the amount of impurities that might normally be incorporated.

The tungsten oxide layer is formed under predetermined film forming conditions. Details on these predetermined film forming conditions are provided in the sections "Method of Manufacturing Organic EL Panel 10" and "Film Forming Conditions for Hole Injection Layer 5". By forming the tungsten oxide layer under these predetermined film forming conditions, the tungsten oxide layer includes an abundance of tungsten oxide crystals 5a as shown by the magnified view of FIG. 7. The crystals 5a are formed so that the particle diameter of each crystal 5a is on the order of nanometers. For example, if the thickness of the hole injection layer 5 is approximately 30 nm, the particle diameter of the crystals 5a is approximately between 3 nm and 10 nm. Hereinafter, the crystals 5a whose particle diameter is on the order of nanometers are referred to as "nanocrystals 5a", and a layered structure composed of nanocrystals 5a is referred to as a "nanocrystal structure". Note that in the hole injection layer 5, regions other than the regions with the nanocrystal structure include an amorphous structure.

In the hole injection layer 5 with the above nanocrystal structure, tungsten atoms (W) constituting the tungsten oxide are distributed to include both tungsten with the maximum valence and tungsten with a valence less than the maximum valence. Typically, the crystal structure of tungsten oxide is not uniform, but rather includes oxygen vacancies or similar structures. Within tungsten oxide having a crystal structure that does not include oxygen vacancies or similar structures, the maximum valence possible for tungsten is a valence of six. On the other hand, within tungsten oxide having a crystal structure that includes oxygen vacancies or similar structures, it is known that the valence of tungsten is a valence of five, which is lower than the maximum valence. A tungsten oxide layer includes tungsten atoms with a variety of valences, including both the maximum valence and a valence lower than the maximum valence. The overall valence for the layer is the average of these different valences.

It has been reported that forming oxygen vacancies or similar structures in tungsten oxide composing a hole injection layer improves the hole conduction efficiency of the hole injection layer due to an electron energy level that is based on oxygen vacancies or similar structures (Non-Patent Literature Kaname Kanai et al., Organic Electronics 11, 188 (2010)). Furthermore, it is known that oxygen vacancies or similar structures are abundant along the crystal surface. The details on this point are described later with reference to FIG. 18.

Therefore, distributing tungsten with a valence of five and tungsten with a valence of six in the tungsten oxide and providing the hole injection layer 5 with oxygen vacancies or similar structures offers the promise of increased hole conduction efficiency of the hole injection layer 5. Specifically, the holes provided from the anode 3 to the hole injection layer 5 are conducted along oxygen vacancies existing along the crystal interface. Therefore, providing the tungsten oxide layer with the nanocrystal structure allows for an increase in the number of paths by which holes are conducted, thus leading to an improvement in hole conduction efficiency. In turn, this allows for a decrease in the driving voltage of the organic EL panel 10.

Additionally, the tungsten oxide forming the hole injection layer 5 has high chemical resistance, i.e. the tungsten oxide does not easily undergo undesired chemical reactions. Therefore, even if the hole injection layer 5 comes into contact with dissolution liquids or the like used during processes performed after formation of the hole injection layer 5, damage to the hole injection layer 5 due to dissolution, degradation, or a change of properties is reduced. Forming the hole injection layer 5 from a material with high chemical resistance thus prevents a reduction in hole conduction properties of the hole injection layer 5.

The hole injection layer 5 in the present embodiment includes both the case of being formed only from tungsten oxide with a nanocrystal structure and the case of being formed from tungsten oxide with a nanocrystal structure and tungsten oxide with an amorphous structure. Furthermore, it is beneficial that the nanocrystal structure is present throughout the hole injection layer 5. However, holes can be conducted from the lower edge of the hole injection layer 5 to the upper edge of the hole injection layer 5, as long as grain boundaries are connected in at least one location between the interface where the anode 3 contacts with the hole injection layer 5 and the interface where the hole injection layer 5 contacts with the hole transport layer 7.

Note that examples have been reported in the past of using a tungsten oxide layer including crystallized tungsten oxide as the hole injection layer. For example, Non-Patent Literature (Jingze Li et al., Synthetic Metals 151, 141 (2005)) reports that crystallizing a tungsten oxide layer by annealing at 450° C. improves hole conduction properties. However, the above Non-Patent Literature does not demonstrate the potential for practical mass-production of a large organic EL panel nor describe the effect on other layers above the substrate due to formation of the hole injection layer. Furthermore, the above Non-Patent Literature does not disclose purposely forming tungsten oxide nanocrystals having oxygen vacancies in the hole injection layer. The hole injection layer 5 according to the present invention is formed from a tungsten oxide layer that is resistant to chemical reactions, is stable, and can withstand the mass production process of large organic EL panels. Furthermore, purposely incorporating oxygen vacancies in the tungsten oxide layer achieves excellent hole conduction properties and hole injection efficiency, which is another decisive difference from conventional technology.

The bank 6 is formed with an organic material such as resin and has insulating properties. Examples of the organic material include acrylic resin, polyimide resin, novolac-type phenolic resin, etc. It is desirable that the bank 6 has organic solvent resistance. Furthermore, since the bank 6 may be etched, baked, etc. when formed, it is beneficial, for example, that the bank 6 is formed from highly resistant material that will not change in shape or quality during the etching and baking processes.

Examples of the material for the hole transport layer 7 include a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, or a tetraphenylbenzene derivative, as disclosed in Japanese Patent Application Publication No. 5-163488. In particular, a porphyrin compound, as well as an aromatic tertiary amine compound and styrylamine compound, are desirable.

The organic light-emitting layer 8 is desirably formed, for example, from a high molecular material—such as polyfluorene, polyphenylene vinylene, polyacetylene, polyphenylene, polyparaphenylene ethylene, poly-3-hexylthiophene, or a derivative of any of these materials or, alternatively, from a fluorescent material recited in Japanese Patent Application Publication No. H5-163488, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc.

Examples of the material for the electron transport layer 9 include a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative, as recited in Japanese Patent Application Publication No. H5-163488.

Note that from the perspective of further improving electron injection characteristics, the above materials for forming the electron transport layer may be doped with an alkali metal or an alkaline-earth metal, such as Na, Ba, or Ca.

The cathode 11 is formed from indium tin oxide (ITO), or indium zinc oxide (IZO), for example. Since the organic EL panel 10 is a top emission type, it is desirable that the cathode 11 is formed from a light-transmissive material.

The passivation layer 12 inhibits the organic light-emitting layer 8, etc. from being exposed to moisture or air, and is formed from a material such as silicon oxide (SiO), silicon nitride (SiN), silicon oxynitride (SiON), silicon carbide (SiC), silicon oxycarbide (SiOC), aluminum nitride (AlN), and aluminum oxide ($Al_2O_3$). Since the organic EL panel 10 is a top emission type, it is desirable that the passivation layer 12 is formed from a light-transmissive material.

<Manufacturing Method of Organic EL Panel 10 according to Present Embodiment>

The following describes an example of the manufacturing process of the organic EL panel 10 according to the present embodiment. FIGS. 8A to 8C and FIGS. 9A to 9C show an example of the manufacturing process of the organic EL panel 10. FIGS. 8A to 8C and FIGS. 9A to 9C schematically show a part of the organic EL panel 10.

First, an Ag thin film is formed, by sputtering, on the interlayer insulation film 2 formed on a main surface of the TFT substrate 1. Subsequently, an ITO thin film is formed on the Ag thin film. The Ag thin film and the ITO thin film are patterned by photolithography, for example, so as to form the anode 3 and the transparent conductive layer 4 in a matrix (see FIG. 8A). Note that the Ag thin film and the ITO thin film may be formed with use of a vacuum deposition method, instead of the sputtering method.

Next, a thin film 51 of tungsten oxide (WOx) or molybdenum tungsten oxide (MoxWyOz) is formed on the transparent conductive layer 4 and portions of the interlayer insulation film 2 on the TFT substrate 1, with use of a composition containing WOx or MoxWyOz through a technology such as vacuum deposition or sputtering (formation process). Next, a photoresist is uniformly applied on the thin film 51 (lamination process) (see FIG. 8B).

Next, a halftone mask is placed on the photoresist thus applied. The light transmittance of the halftone mask differs for each of the R, G, and B colors. Then, the photoresist is exposed to light from over the halftone mask to form a resist pattern having a different thickness for each of the R, G, and B colors (adjustment process). Subsequently, the photoresist and portions of the thin film 51, including the top of the thin film 51, are washed off by a developing solution (shaping process). In this way, the patterning of the thin film 51 having a different thickness for each of the R, G, and B colors is completed. After that, the photoresist (resist residues) on the patterned thin film 51 is washed and rinsed with pure water (removal process). This completes the hole injection layers 5 of the R, G, and B colors that each have a different thickness (see FIG. 8C).

Next, a bank material layer composed of an insulating organic material is formed on the hole injection layers 5. The bank material layer is formed by an application method, for example. A mask having an opening having a predetermined shape is placed on the bank material layer. After exposing the bank material layer to light, redundant part of the bank material layer is washed off with the developing solution. This completes the patterning of the bank material layer. With the above steps, forming of the banks 6 is completed (see FIG. 9A).

Next, within each region that is defined by the banks 6 and is above the anode 3, ink composition (hereinafter, simply "ink") including a material for a hole transport layer is filled with use of an inkjet method. The ink filled in each of the regions is then dried to form the hole transport layers 7.

Next, ink composition (hereinafter, simply "ink") including an organic EL material is dripped within each region defined by the banks 6 by using an inkjet method or the like. The ink filled in each of the regions is then dried to form the organic light-emitting layers 8 (see FIG. 9B). Note that the organic light-emitting layers 8 may be formed with use of a dispenser method, a nozzle coating method, a spin coat method, an intaglio printing, a letter press printing, or the like.

Next, the electron transport layer 9 is formed by vacuum deposition, for example. Then, an ITO thin film constituting the cathode 11 is formed on the electron transport layer 9, and the passivation layer 12 is formed on the cathode 11 (see FIG. 9C).

The following describes in detail film forming conditions for a tungsten oxide layer to include an abundance of tungsten oxide crystals 5a.

As described above, the tungsten oxide layer is formed through a technology such as vacuum deposition or sputtering. In particular, it is beneficial that the tungsten oxide layer is formed with use of a reactive sputtering method. Specifically, metal tungsten is placed in a chamber as a sputtering target, with argon gas as a sputtering gas and oxygen gas as a reactive gas. Under this condition, the argon in the argon gas is ionized by the application of high voltage, and the ionized argon is caused to bombard the sputtering target. The metal tungsten ejected as a result of a sputtering phenomenon reacts with the oxygen gas to produce tungsten oxide, thus forming the tungsten oxide layer on the transparent conductive layer 4.

While details on this film forming conditions are provided in the following section, in brief, the following conditions are desirable: (1) the total pressure of the sputtering gas composed of argon gas and oxygen gas should be at least 2.3 Pa and at most 7.0 Pa, and (2) the partial pressure of the oxygen gas with respect to the total pressure of the sputtering gas should be at least 50% and at most 70%. Furthermore, (3) the input power per unit area of the target (input power density) should be at least 1.5 $W/cm^2$ and at most 6.0 $W/cm^2$, and (4) the value yielded by dividing the total pressure of the sputtering gas by the input power density should be larger than 0.7 $Pa \cdot cm^2/W$. A tungsten oxide layer having a nanocrystal structure is formed under these film forming conditions.

As described above, the tungsten oxide forming the hole injection layer 5 has high chemical resistance. Therefore, even if the hole injection layer 5 comes into contact with dissolution liquids or the like used during subsequent processes, damage to the hole injection layer 5 due to dissolution, degradation, or a change of properties is reduced.

<Experiments on Film Forming Conditions for Hole Injection Layer 5 and Analysis of Results>

(Film Forming Conditions for Hole Injection Layer 5)

In the present embodiment, the tungsten oxide layer constituting the hole injection layer 5 is formed under predetermined film forming conditions, thus intentionally providing the hole injection layer 5 with a nanocrystal structure to improve hole conduction properties of the hole injection layer 5 and allows for a low driving voltage for the organic EL panel 10. These predetermined film forming conditions are now described in detail.

A DC magnetron sputtering device was used as a sputtering device, with metal tungsten as a sputtering target. The substrate temperature was not controlled. It is considered desirable to form the tungsten oxide layer using the reactive sputtering method, with argon gas as the sputtering gas, oxygen gas as the reactive gas, and an equivalent amount of each gas released.

In order to form a tungsten oxide layer with high crystallinity, it is necessary for atoms to form a regular film on the substrate, and it is desirable to form the film at as low a deposition rate as possible. The film formation rate during film formation by sputtering is considered to depend on the above conditions (1) through (4). As a result of the experiments described below, it was confirmed that with the above numerical ranges for conditions (1) through (4), the driving voltage lowers, and a tungsten oxide layer with high crystallinity is obtained.

With respect to condition (1), note that while the upper limit of the total pressure in the experiment conditions described below is 4.7 Pa, it was confirmed separately that a similar trend is exhibited at least up to 7.0 Pa.

Furthermore, with respect to condition (2), while the partial pressure of the oxygen gas with respect to the total pressure is set to 50%, the reduction in driving voltage was confirmed at least in the range between 50% and 70%.

A further explanation of condition (4) is now provided. When the amounts of argon gas and oxygen gas that are released are equivalent, it is assumed that the film formation rate is determined by the input power density and the pressure at the time of film formation (total pressure). The input power density in condition (3) changes both the number and energy of sputtered tungsten atoms and tungsten atom clusters. In other words, by reducing the input power density, the number of sputtered tungsten atoms decreases, so that the tungsten oxide layer can be formed on the substrate at a low energy, thus offering the promise of film formation at a low film formation rate. The total pressure at the time of film formation in condition (1) changes the mean free path to the film formation substrate of the tungsten atoms and tungsten atom clusters that are sputtered and released in the gas phase. In other words, when the total pressure is high, the tungsten atoms and tungsten atom clusters have a higher probability of repeatedly colliding with gas components in the film formation chamber before reaching the substrate. It is considered that an increase in the randomness of the flying tungsten atoms and tungsten atom clusters reduces the number of tungsten atoms that form as a film on the substrate and causes the tungsten to form the film at a low energy. As a result, film formation at a low film formation rate can be expected.

It is considered, however, that there are limits to the extent to which device characteristics can be improved by independently controlling the input power density and the total pressure at the time of film formation in order to change the film formation rate during sputtering. Accordingly, the value yielded by dividing the total pressure at the time of film formation (Pa) by the input power density (W/cm$^2$) was established as a new film forming condition (4) serving as an index to determine the film formation rate of the tungsten atoms.

Through experimentation, the following tendencies were confirmed: as the value of the film forming condition (4) increases, the driving voltage decreases, and the film formation rate decreases; conversely, as the value of the film forming condition (4) decreases, the driving voltage increases, and the film formation rate increases.

Specifically, in the experiment conditions described below, the total pressure/power density was at least 0.78 Pa·cm$^2$/W. A value larger than 0.7 Pa·cm$^2$/W is considered exemplary, and for even more reliable film formation, a value of 0.8 Pa·cm$^2$/W or greater is considered desirable. On the other hand, the upper limit on the total pressure/power density was 3.13 Pa·cm$^2$/W in the experiment conditions. A value less than 3.2 Pa·cm$^2$/W is considered necessary, and for even more reliable film formation, a value of 3.1 Pa·cm$^2$/W or less is considered desirable. As described above, however, out of consideration for the film formation rate, restrictions are not necessarily placed on the upper limit.

Next, the inventors confirmed the validity of the above film forming conditions through experiments.

Figure 10:
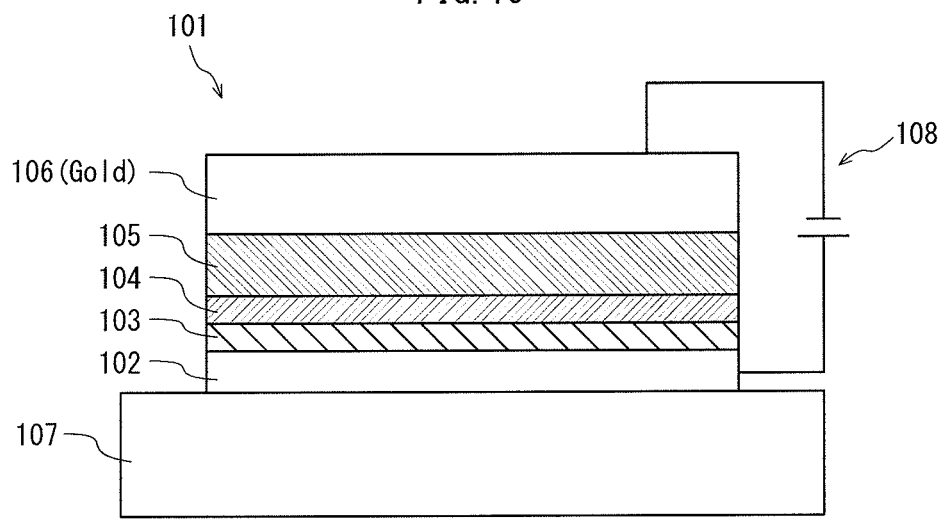
FIG. 10 is a schematic cross-sectional view showing the structure of a hole-only device 101.

First, hole-only devices 101 as shown in FIG. 10 were manufactured as assessment devices in order to assess the degree to which the hole conduction efficiency from the hole injection layer 5 to the hole transport layer 7 depends on film forming conditions.

In an actual operating organic EL element, the carriers constituting electric current consist of both holes and electrons. As such, the electrical characteristics of an organic EL element reflect not only hole current, but also electron current. In a hole-only device, however, the injection of electrons from the cathode is blocked, and there is almost no flow of electron current. Therefore, the current consists almost entirely of hole current. The carriers can thus be considered almost entirely to be holes, making the hole-only device appropriate for assessment of hole conduction efficiency.

As shown in FIG. 10, each of the hole-only devices 101 was composed of the following layered on a substrate 107 in this order: an anode 102 composed of an ITO thin film with a thickness of 50 nm; a hole injection layer 103 composed of tungsten oxide and having a thickness of 30 nm; a hole transport layer 104 composed of TFB and having a thickness of 20 nm; an organic light-emitting layer 105 composed of F8BT and having a thickness of 70 nm; and a cathode 106 composed of gold and having a thickness of 100 nm. Since the following experiments were conducted in order to assess hole conduction efficiency, the organic light-emitting layer 105 has a thickness of 70 nm, which does not fall within the range of 32 nm to 48 nm. However, it goes without saying that this range of 32 nm to 48 nm is suitable for the organic EL panel 10.

In the manufacturing of the hole-only devices 101, the hole injection layer 103 was formed by applying the reactive sputtering method with a DC magnetron sputtering device. The gas introduced into the chamber was composed of at least one of argon gas and oxygen gas, and the sputtering target used was metal tungsten. The substrate temperature was not controlled, whereas the total pressure was adjusted by varying the flow amount of each gas. As shown in Table 1, the hole-only device 101 was manufactured under each of five film forming conditions, A through E. The total pressure and the input power density differed between the film forming conditions, as can be seen in Table 1. The partial pressure of the argon gas and the oxygen gas in the chamber were each 50%.

Hereinafter, the hole-only device 101 formed under film forming conditions A is referred to as HOD-A, the hole-only device 101 formed under film forming conditions B is referred to as HOD-B, the hole-only device 101 formed under film forming conditions C is referred to as HOD-C, the hole-only device 101 formed under film forming conditions D is referred to as HOD-D, and the hole-only device 101 formed under film forming conditions E is referred to as HOD-E.

TABLE 1

| Film Forming Conditions | Total Pressure (Pa) | Oxygen Partial Pressure (%) | Input Power Density (W/cm$^2$) | Total Pressure/ Power Density (Pa · cm$^2$/W) |
|---|---|---|---|---|
| A | 4.70 | 50 | 1.50 | 3.13 |
| B | 4.70 | 50 | 3.00 | 1.57 |

TABLE 1-continued

| Film Forming Conditions | Total Pressure (Pa) | Oxygen Partial Pressure (%) | Input Power Density (W/cm²) | Total Pressure/ Power Density (Pa · cm²/W) |
|---|---|---|---|---|
| C | 4.70 | 50 | 6.00 | 0.78 |
| D | 2.35 | 50 | 1.50 | 1.57 |
| E | 2.35 | 50 | 6.00 | 0.39 |

The completed hole-only devices were then connected to a direct current power supply 108 and voltage was applied thereto. Further, the voltage applied to each hole-only device was changed to measure the values of electric current flowing at different voltages. Each current value is then converted into a value per unit area (current density).

Figure 11:
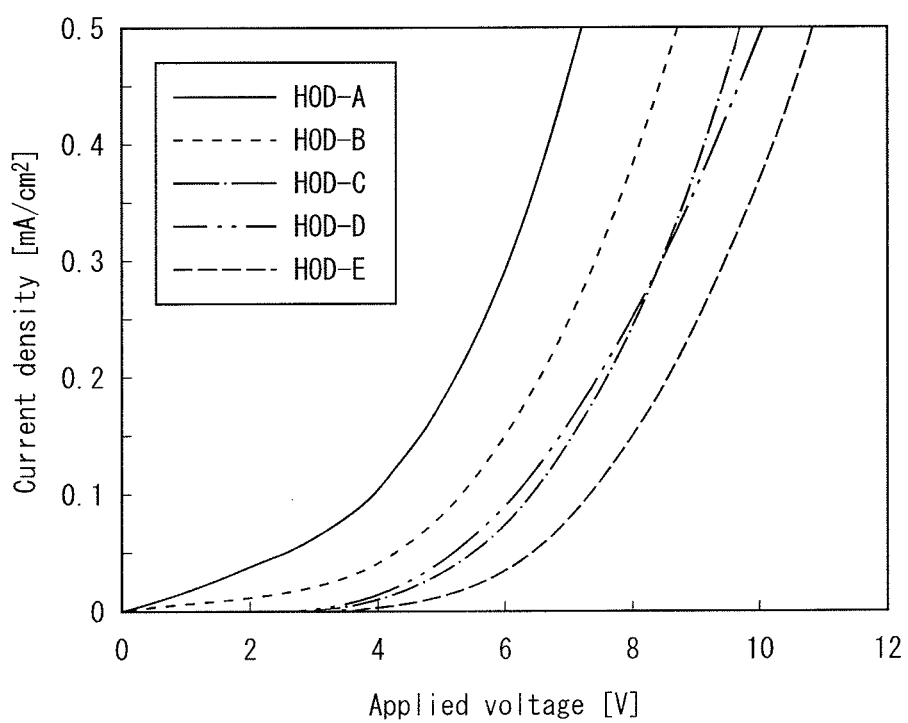
FIG. 11 is a device characteristics diagram showing a relation curve illustrating a relation between applied voltage and current density of hole-only devices.

FIG. 11 is a device characteristics diagram showing relation curves each showing a relation between applied voltage and current density of a hole-only device. In the figure, the vertical axis indicates current density (mA/cm²), whereas the horizontal axis indicates applied voltage (V).

Table 2 shows the driving voltage for each sample HOD-A through HOD-E yielded by the experiment. Note that the expression "driving voltage" in Table 2 is the voltage applied when the current density value is a specific, practical value of 0.3 mA/cm².

TABLE 2

| Name of Sample | Driving Voltage (V) |
|---|---|
| HOD-A | 6.25 |
| HOD-B | 7.50 |
| HOD-C | 8.50 |
| HOD-D | 8.50 |
| HOD-E | 9.49 |

It can said that as the driving voltage grows smaller, the hole conduction efficiency of the hole injection layer 103 is higher. This is because the components of each hole-only device other than the hole injection layer 103 are prepared according to the same manufacturing method. Therefore, other than the hole injection layer 103, the hole injection barrier between two adjacent layers can be assumed to be constant. Furthermore, it was confirmed through another experiment that the anode 102 and the hole injection layer 103 in this experiment are in ohmic contact. Accordingly, the differences in driving voltage depending on the film forming conditions for the hole injection layer 103 can be considered to strongly reflect the hole conduction efficiency from the hole injection layer 103 to the hole transport layer 104.

As shown in Table 2 and FIG. 11, it is clear that as compared to HOD-E, which is manufactured under the film forming conditions with a low total pressure and the maximum input power density, HOD-A through HOD-D have superior hole conduction efficiency.

Figure 12:
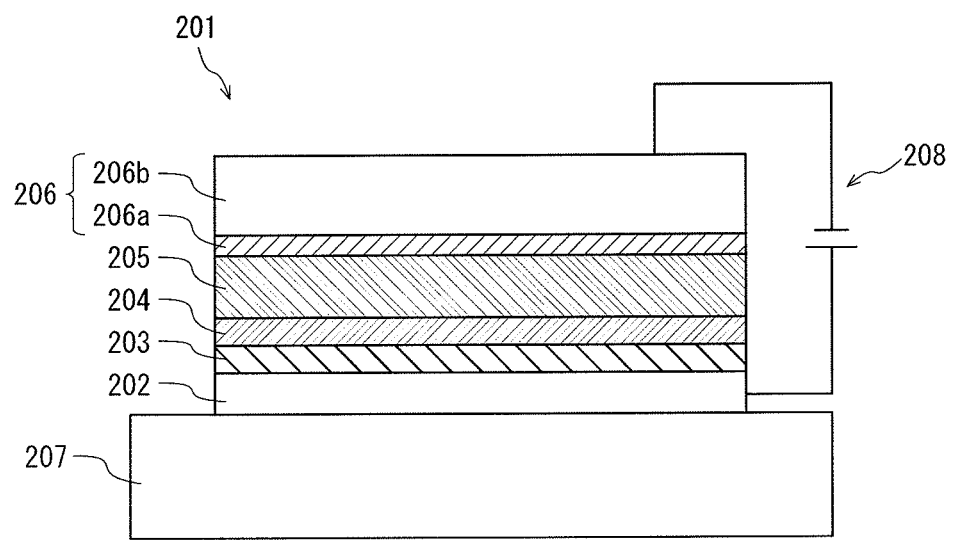
FIG. 12 is a schematic cross-sectional view showing the structure of an organic EL element 201.

Thus far, tests on the hole conduction efficiency of the hole injection layer 103 in each of the hole-only devices 101 have been described. Note that in the organic EL panel as well, the dependence of the hole conduction efficiency from the hole injection layer 5 to the hole transport layer 7 on film forming conditions is essentially the same as in the hole-only devices 101. In order to confirm this point, organic EL elements 201 were prepared using a hole injection layer formed under film forming conditions A through E. As shown in FIG. 12, each of the organic EL elements was composed of the following layered on a substrate 207 in this order: an anode 202 composed of an ITO thin film with a thickness of 50 nm; a hole injection layer 203 composed of tungsten oxide and having a thickness of 30 nm; a hole transport layer 204 composed of TFB and having a thickness of 20 nm; an organic light-emitting layer 205 composed of F8BT and having a thickness of 70 nm; and a cathode 206 composed of a 5-nm layer of barium and a 100-nm layer of aluminum. Hereinafter, the organic EL element 201 formed under film forming conditions A is referred to as BPD-A, the organic EL element 201 formed under film forming conditions B is referred to as BPD-B, the organic EL element 201 formed under film forming conditions C is referred to as BPD-C, the organic EL element 201 formed under film forming conditions D is referred to as BPD-D, and the organic EL element 201 formed under film forming conditions E is referred to as BPD-E.

The organic EL elements 201 prepared under film forming conditions A through E were then connected to a direct current power supply 208 and voltage was applied thereto. Further, the voltage applied to each hole-only device was changed to measure the values of electric current flowing at different voltages. Each current value is then converted into a value per unit area (current density).

Figure 13:
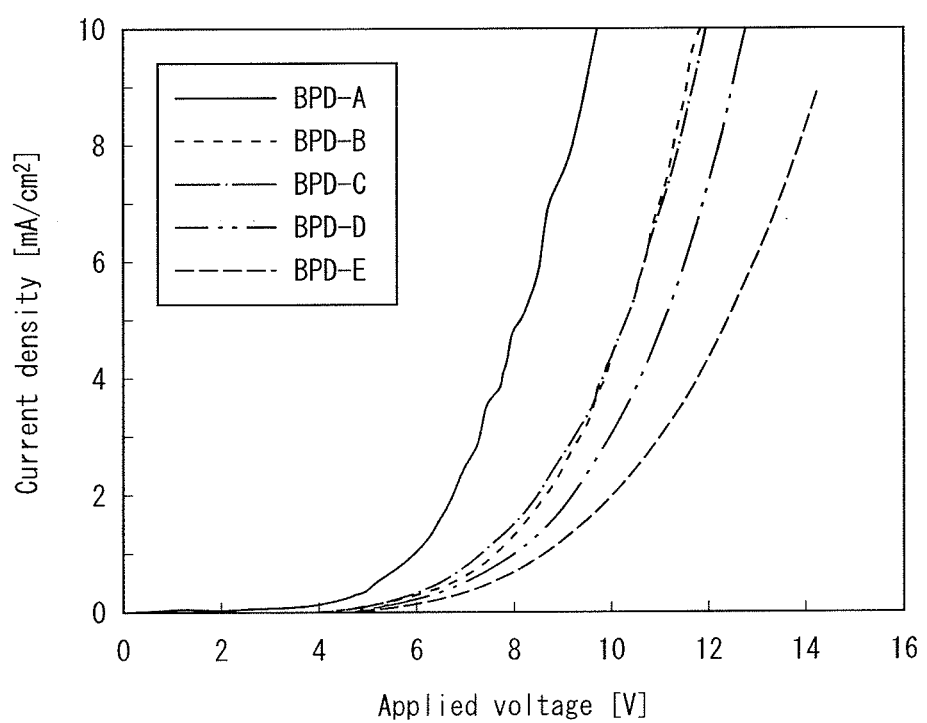
FIG. 13 is a device characteristics diagram of relation curves each illustrating a relation between applied voltage and current density of the organic EL element 201.

FIG. 13 is a device characteristics diagram showing relation curves each showing a relation between applied voltage and current density of an organic EL element. In the figure, the vertical axis indicates current density (mA/cm²), whereas the horizontal axis indicates applied voltage (V). Table 3 shows the driving voltage for each sample BOD-A through BOD-E yielded by the experiment. Note that the expression "driving voltage" in Table 3 is the voltage applied when the current density value is a specific, practical value of 8 mA/cm².

TABLE 3

| Name of Sample | Driving Voltage (V) |
|---|---|
| BPD-A | 9.25 |
| BPD-B | 11.25 |
| BPD-C | 11.50 |
| BPD-D | 12.25 |
| BPD-E | 14.00 |

As shown in Table 3 and FIG. 13, compared to the other organic EL elements, the current density-applied voltage curve rises the slowest for BPD-E, which requires the highest applied voltage in order to achieve a high current density. This trend is similar to the trend observed in the hole-only devices HOD-A through HOD-E, which were prepared under the same respective film forming conditions.

From the above results, it was confirmed that in the organic EL elements 201 as well, the hole conduction efficiency of the hole injection layer 203 depends on the film forming conditions, similarly to the case of the hole-only devices 101. Specifically, it was confirmed that in the organic EL elements 201 as well, forming the film under the conditions provided by the ranges in film forming conditions A, B, C, and D increases the hole conduction efficiency from the hole injection layer 203 to the hole transport layer 204, thereby achieving a low driving voltage. As described above, not only the hole-only devices 101 but also the organic EL elements 201 can improve hole conduction efficiency from the hole injection layer to the hole transport layer. Accordingly, the organic EL panel 10 also has an improved hole conduction efficiency from the hole injection layer 5 to the hole transport layer 7, realizing a low driving voltage.

Note that among the above conditions, the condition concerning input power is represented in terms of input power density, as indicated in Table 1. When using a DC magnetron sputtering device that is different from the DC magnetron sputtering device used in the present experiment, a hole injection layer composed of a tungsten oxide layer with excellent hole conduction efficiency, as in the present experiment, can be yielded by adjusting the input power according to the size of the magnet at the back surface of the sputtering target so that the input power density fulfills the above condition. Conditions on total pressure and oxygen partial pressure, on the other hand, are independent of the device, the size of the target, and the magnet size of the target.

Additionally, the sputtering device was placed under room temperature during the experiment, and the substrate temperature was not intentionally adjusted while forming the hole injection layer with use of the reactive sputtering method. Therefore, the substrate was at room temperature at least before the forming of the hole injection layer. However, during the formation of the hole injection layer, there is a possibility that the substrate temperature may rise by several tens of degrees Celsius.

Note that through a separate experiment, the inventors confirmed that when the oxygen partial pressure is raised too high, the driving voltage conversely ends up rising. Accordingly, it is desirable for the oxygen partial pressure to be between 50% and 70%.

The above experiment results indicate that for a low driving voltage, an organic EL panel provided with a hole injection layer manufactured under film forming conditions A, B, C, or D is desirable, and that an organic EL panel manufactured under film forming conditions A or B is even more desirable. Hereinafter, an organic EL panel provided with a hole injection layer manufactured under film forming conditions A, B, C, or D is the target of the present disclosure.

(Chemical State of Tungsten in Hole Injection Layer)

The above-described nanocrystal structure exists in the tungsten oxide constituting the hole injection layer 5 in the organic EL panel 10 of the present embodiment. This nanocrystal structure is formed by adjusting the film forming conditions described in the experiments above. Details concerning this point are provided in the following.

In order to confirm that a nanocrystal structure is found in the tungsten oxide layer formed under the above film forming conditions A through E, a hard X-ray photoelectron spectroscopy (HAXPES) measurement (hereinafter, simply "XPS measurement") experiment was performed. Typically, the information depth of an optical spectrum yielded by hard X-ray photoelectron spectroscopy (hereinafter, simply "XPS spectrum") reflecting the average valence of the layer is determined by the angle between a surface of the target of measurement and the direction in which photoelectrons are detected by a detector that ejects photoelectrons. In the present experiment, the angle between the direction in which photoelectrons are detected and the surface of the tungsten oxide layer during the XPS measurement was 40° in order to observe the average valence of the tungsten oxide layer in the direction of thickness of the tungsten oxide layer.

The conditions under which the XPS measurement was conducted are as follows. Note that no charge-up occurred during the measurement.

(XPS Measurement Conditions)

Device used: R-4000 (manufactured by VG-SCIENTA)

Light source: synchrotron radiation (7856 eV)

Bias: None

Electron emission angle: angle of 40° with substrate surface

Interval between measurement points: 0.05 eV

Samples for XPS measurement were manufactured under the film forming conditions A through E shown in Table 1. A hole injection layer was formed to a thickness of 30 nm by the above reactive sputtering method on an ITO conductive substrate formed on glass. The result was taken as a sample for XPS measurement. The samples for XPS measurement manufactured under the film forming conditions A, B, C, D, and E are hereinafter respectively referred to as sample A, sample B, sample C, sample D, and sample E. XPS measurement was then performed on the surface of the hole injection layer in each of the samples A through E. FIG. 14 is a diagram showing the resulting spectra.

In FIG. 14, the horizontal axis represents binding energy, corresponding to the energy level of the photoelectrons at each energy level with the X-ray as a reference. The left direction with respect to the origin is positive. The vertical axis represents photoelectron intensity and corresponds to the number of individually measured photoelectrons. As shown in FIG. 14, three peaks were observed. From the left side of the figure to the right, the peaks belong to the following energy levels of tungsten: $5p_{3/2}$ ($W5p_{3/2}$), $4f_{5/2}$ ($W4f_{5/2}$), $4f_{7/2}$ ($W4f_{7/2}$).

Next, peak fitting analysis was performed on the peaks belonging to the energy levels $W5p_{3/2}$, $W4f_{5/2}$, and $W4f_{7/2}$ of the spectra for sample A and, as a comparative example, for sample E. The peak fitting analysis was performed as follows.

The peak fitting analysis was performed using XPSPEAK Version 4.1, which is software for photoelectron spectroscopy analysis. First, based on the photoionization cross-section for a hard X-ray energy of 7940 eV, the peak area intensity ratio for the energy levels $W4f_{7/2}$, $W4f_{5/2}$, and $W5p_{3/2}$, was fixed as follows: $W4f_{7/2}:W4f_{5/2}:W5p_{3/2}=4:3:10.5$. Further, as shown in Table 4, the peak top belonging to a valence of six at the surface discontinuity energy level of $W4f_{7/2}$ ($W^{6+}4f_{7/2}$) was aligned with an energy of 35.7 eV. Next, the peak energy and the peak full width at half maximum for each of the peaks belonging to the surface photoelectron peak of $W5p_{3/2}$, ($W^{sur}5p_{3/2}$), a valence of six at the surface discontinuity energy level ($W^{6+}5p_{3/2}$), and a valence of five at the surface discontinuity energy level ($W^{5+}5p_{3/2}$) of W5p3/2 were set to the values listed in Table 4. Similarly, for $W4f_{5/2}$ and $W4f_{7/2}$, the peak energy and the peak full width at half maximum for each of the peaks belonging to the surface photoelectron peak ($W^{sur}4f_{5/2}$, $W^{sur}4f_{7/2}$), a valence of six at the surface discontinuity energy level ($W^{6+}4f_{5/2}$), and a valence of five at the surface discontinuity energy level ($W^{5+}4f_{5/2}$, $W^{5+}4f_{7/2}$) were set to the values listed in Table 4. After setting the peak intensities to a desired value, calculations were performed a maximum of 100 times using a Gaussian-Lorentzian mixed function to obtain the final peak fitting analysis results. In the mixed function, the ratio in the Lorentzian function was set as indicated in Table 4.

TABLE 4

| Corresponding peak | W5p$_{3/2}$ | | | W4f$_{5/2}$ | | | W4f$_{7/2}$ | | |
| --- | --- | --- | --- | --- | --- | --- | --- | --- | --- |
| | W$^{sur}$5p$_{3/2}$ | W$^{6+}$5p$_{3/2}$ | W$^{5+}$5p$_{3/2}$ | W$^{sur}$4f$_{5/2}$ | W$^{6+}$4f$_{5/2}$ | W$^{5+}$4f$_{5/2}$ | W$^{sur}$4f$_{7/2}$ | W$^{6+}$4f$_{7/2}$ | W$^{5+}$4f$_{7/2}$ |
| Peak Energy (eV) | 42.30 to 43.07 | 41.20 to 41.30 | 39.70 to 38.65 | 38.75 to 39.13 | 37.80 to 37.85 | 36.72 to 36.95 | 36.60 to 36.90 | 35.70 (reference) | 34.60 to 34.80 |
| Value of full width at half maximum (eV) | 1.73 to 2.40 | 1.93 to 2.24 | 1.8 to 2.86 | 1.40 to 1.60 | 0.87 to 0.98 | 0.90 to 1.50 | 1.40 to 1.60 | 0.87 to 0.98 | 0.90 to 1.50 |
| Lorentzian function ratio (%) | 0 | 13 to 40 | 0 to 25 | 0 to 57 | 0 to 6 | 0 to 20 | 0 to 57 | 0 to 6 | 0 to 20 |

Figure 15A:
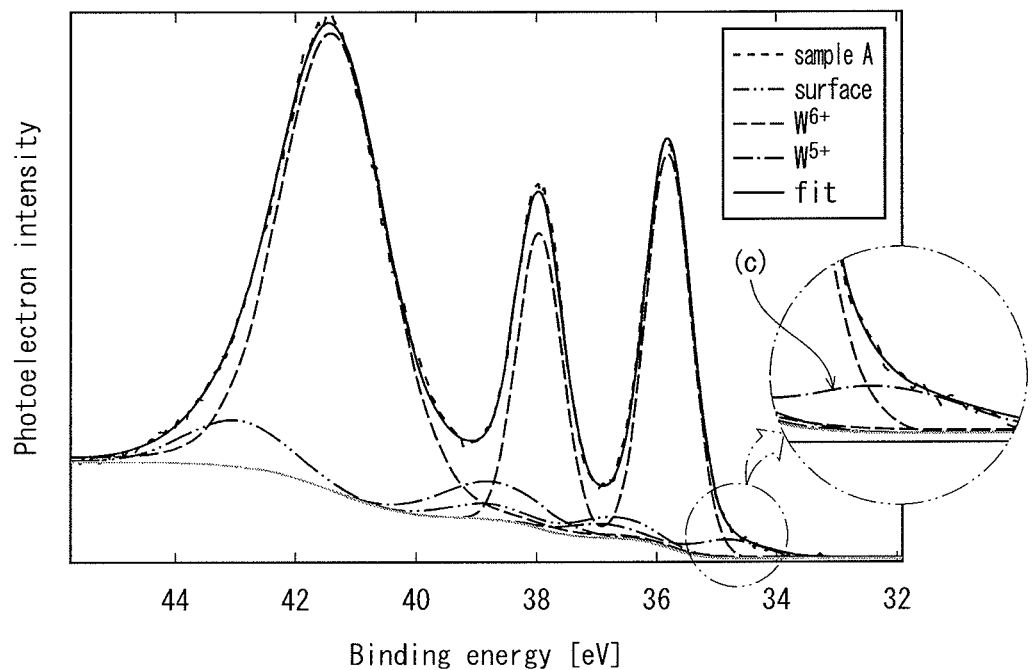
FIG. 15A shows peak fitting analysis results for sample A in FIG. 14.
Figure 15B:
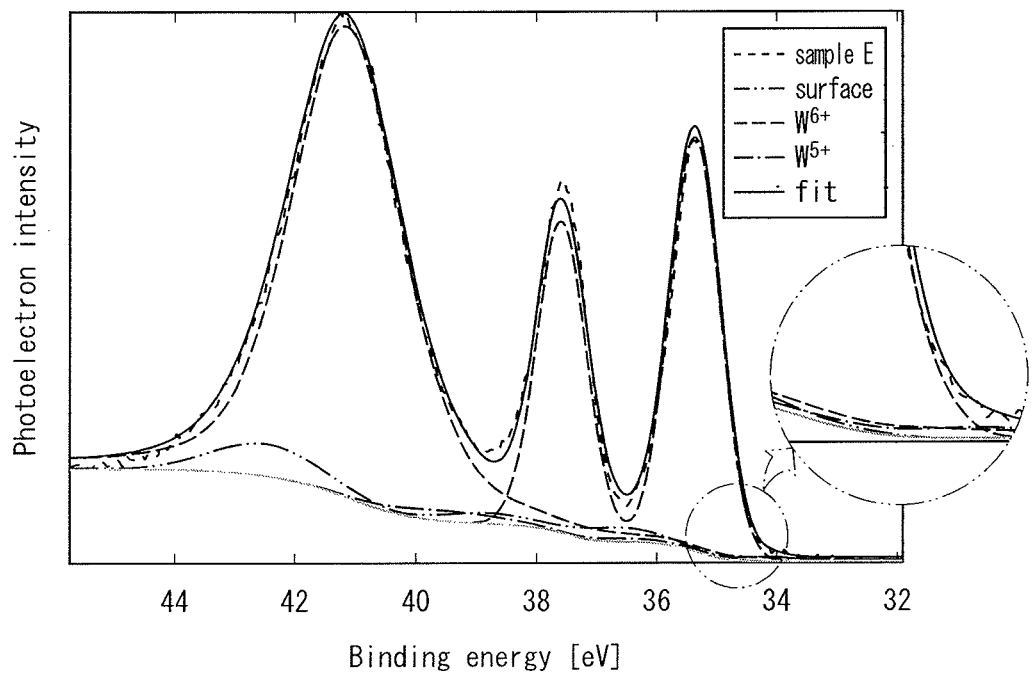
FIG. 15B shows peak fitting analysis results for sample E in FIG. 14.

FIGS. 15A and 15B show the final peak fitting analysis results. FIG. 15A shows the analysis results for sample A, and FIG. 15B shows the analysis results for sample E.

In both FIGS. 15A and 15B, the dashed lines (sample A, sample E) are actual measured spectra (corresponding to the spectra in FIG. 14), the lines with alternate long and two short dashes (surface) are the spectra belonging to the surface photoelectron peaks of W$^{sur}$5p$_{3/2}$, W$^{sur}$4p$_{5/2}$ and W$^{sur}$4f$_{7/2}$, the dotted lines (W$^{6+}$) are the spectra belonging to a valence of six at the surface discontinuity energy level of W$^{6+}$5p$_{3/2}$, W$^{6+}$4f$_{7/2}$, and W$^{6+}$4f$_{5/2}$, and the alternating long and short dashed lines (W$^{5+}$) are the spectra belonging to a valence of five at the surface discontinuity energy level of W$^{5+}$5p$_{3/2}$, W$^{5+}$4f$_{5/2}$, and W$^{5+}$4f$_{7/2}$. The solid lines (fit) are the spectra yielded by summing the spectra indicated by the lines with alternate long and two short dashes and the alternating long and short dashed lines. Note that in FIGS. 15A and 15B, the peak belonging to the tungsten with a valence of five indicated by the alternating long and short dashed line is considered to derive only from tungsten with a valence of five.

As shown in FIGS. 15A and 15B, the spectra belonging to the energy levels 5p$_{3/2}$, 4f$_{5/2}$, and 4f$_{7/2}$, are constituted by a sum of the peak due to photoelectrons from the surface of the hole injection layer (surface), the peak of tungsten with a valence of six included at the depth at which photoelectrons are detected within the hole injection layer (W$^{6+}$), and the peak of tungsten with a valence of five included at the same depth (W$^{5+}$).

Furthermore, FIG. 15A shows that for sample A, a peak for W$^{5+}$ corresponding to each energy level occurs in a binding energy region that is 0.3 eV to 1.8 eV lower than each of the peaks belonging to the energy levels 5p$_{3/2}$, 4f$_{5/2}$, and 4f$_{7/2}$, in the W$^{6+}$ spectrum. On the other hand, in FIG. 15B, no such peak for W$^{5+}$ is evident for sample E. For the purposes of illustration, the peak belonging to 4f$_{7/2}$ in the W$^{5+}$ spectrum for sample A and for sample E is shown enlarged to the right of FIGS. 15A and 15B. As shown in (c) of FIG. 15A, the peak in W$^{5+}$ is clearly observable for sample A, whereas no such peak in W$^{5+}$ is observable for sample E.

Furthermore, looking more closely at the enlarged diagrams in FIGS. 15A and 15B, the solid line (fit), which is the summed spectrum resulting from peak fitting, exhibits a large "shift" in sample A with respect to the spectrum for W$^{6+}$ indicated by the dotted line (W$^{6+}$). In sample E, however, the "shift" is not as large as in sample A. In other words, the "shift" in sample A can be inferred as suggestive of the existence of tungsten with a valence of five.

Next, for samples A through E, the abundance ratio W$^{5+}$/W$^{6+}$ of the number of atoms of tungsten with a valence of five versus the number of atoms of tungsten with a valence of six was calculated. The abundance ratio was calculated, in the spectrum obtained through peak fitting analysis on each sample, by dividing the area intensity of the peak for W$^{5+}$ (alternating long and short dashed line) by the area intensity of the peak for W$^{6+}$ (dotted line).

Note that in principle, representing the abundance ratio of the number of atoms of tungsten with a valence of six to the number of atoms of tungsten with a valence of five as the ratio of the area intensity of the peak for W$^{6+}$ to the area intensity of the peak for W$^{5+}$ in W4f$_{7/2}$ is equivalent to representing the abundance ratio based on the peaks belonging to W5p$_{3/2}$ and W4f$_{5/2}$. In the present experiment, it was confirmed that the ratio of the area intensity of W$^{5+}$4f$_{7/2}$ to the area intensity of W$^{6+}$4f$_{7/2}$, in W4f$_{7/2}$, was indeed the same value for W5p and for W4f$_{5/2}$ as well. Accordingly, in the following analysis, only the peak belonging to W4f$_{7/2}$ is considered.

Table 5 shows the ratio W$^{5+}$/W$^{6+}$ for samples A through E.

TABLE 5

| Name of Sample | W$^{5+}$/W$^{6+}$ |
| --- | --- |
| Sample A | 7.4% |
| Sample B | 6.1% |
| Sample C | 3.2% |
| Sample D | 3.2% |
| Sample E | 1.8% |

Based on the values of W$^{5+}$/W$^{6+}$ in Table 5, it was confirmed that the sample including the most tungsten atoms with a valence of five was sample A, followed by samples B, C, and D in decreasing order. Furthermore, based on the results in Table 3 and Table 5, it became clear that as the value of W$^{5+}$/W$^{6+}$ increases, the driving voltage of the organic EL element decreases.

(Electronic State of Tungsten in Hole Injection Layer)

The tungsten oxide layer formed under the above film forming conditions A through D has, in an electronic state thereof, an occupied energy level in a binding energy region that is between 1.8 eV and 3.6 eV lower than the upper end of the valence band, i.e. the lowest binding energy of the valence band. Furthermore, the occupied energy level corresponds to the energy level of the highest occupied molecular orbital (HOMO) of the hole injection layer. That is, in the electronic state of the hole injection layer, the occupied energy level is closest to the Fermi surface of the hole injection layer, in terms of binding energy. The occupied energy level is hereinafter referred to as "the occupied energy level near the Fermi surface".

Due to the existence of this occupied energy level near the Fermi surface, a so-called interface energy level alignment is formed at the layer interface between the hole injection layer 5 and the hole transport layer 7, so that the binding energy of the highest occupied molecular orbital of the hole transport layer 7 and the binding energy of the occupied energy level near the Fermi surface of the hole injection layer 5 become approximately equal. In other words, due to the existence of the occupied energy level, the hole injection barrier between the hole injection layer 5 and the hole transport layer 7 is reduced. This allows for even better hole conduction efficiency as well as driving at a lower voltage.

Note that the expressions "approximately equal to" and "interface energy level alignment is formed" as referred to herein indicate that at the interface between the hole injection layer 5 and the hole transport layer 7, the difference between the lowest binding energy at the occupied energy level near the Fermi surface and the lowest binding energy at the highest occupied molecular orbital is ±0.3 eV.

Furthermore, the expression "interface" as referred to herein denotes an area that includes a surface of the hole injection layer 5 and a portion of the hole transport layer 7 within a distance of 0.3 nm from the surface of the hole injection layer 5.

While it is desirable that the occupied energy level near the Fermi surface exists throughout the hole injection layer 5, it suffices for this occupied energy level to exist at the interface with the hole transport layer 7.

Next, experiments to confirm the existence of the occupied energy level near the Fermi surface in the hole injection layer of sample A and sample E were performed using ultraviolet photoelectron spectroscopy (UPS) measurement.

The forming of the hole injection layer in sample A and sample E was performed inside a sputtering device. Then, to prevent atmospheric exposure, samples A and E were transported to a glovebox which was connected to the sputtering device and which was filled with nitrogen gas. Subsequently, the sample devices were sealed inside transfer vessels in the glovebox, and were mounted on a photoelectron spectroscopy device. After formation, the hole injection layer was therefore not exposed to the atmosphere before UPS measurement was performed.

In general, a UPS spectrum obtained as a result of the UPS measurement reflects a state of occupied energy levels, such as a valence band, within several nanometers in distance from the surface of the target of measurement. As such, the present experiment was conducted in order to observe the state of occupied energy levels at a surface portion of the hole injection layer by utilizing UPS measurement.

The conditions under which the UPS measurement was conducted are as follows. Note that charge-up did not occur during measurement.

(UPS Measurement Conditions)

Device used: PHI 5000 VersaProbe Scanning X-ray Photoelectron Spectroscopy Device (manufactured by ULVAC-PHI, Inc.)

Light source: He I line

Bias: None

Electron emission angle: Normal line direction of the substrate surface

Interval between measurement points: 0.05 eV

Figure 16:
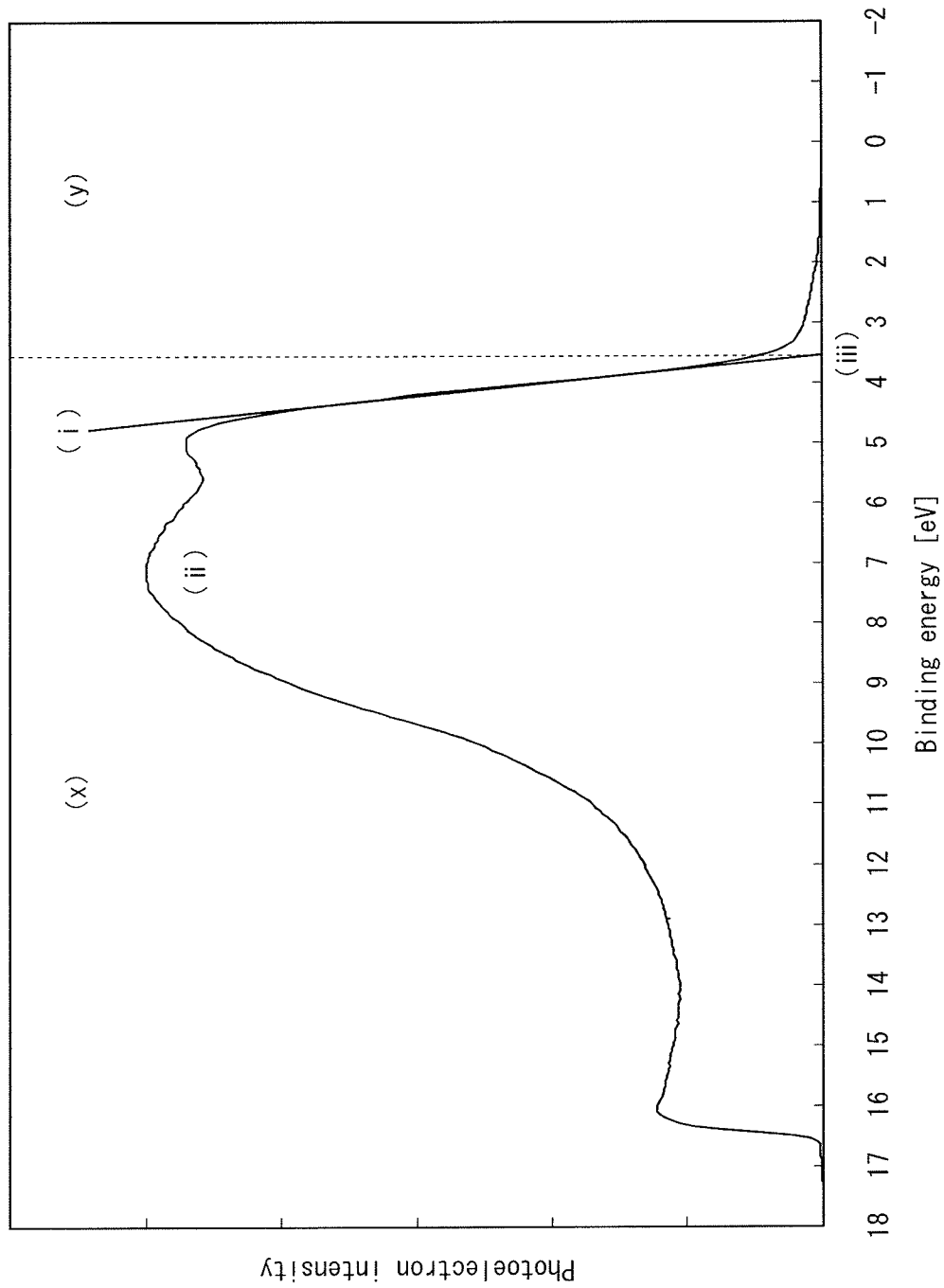
FIG. 16 is a diagram showing a UPS spectrum of the surface of the tungsten oxide layer.

FIG. 16 shows a UPS spectrum of the hole injection layer of sample A. In FIG. 16, the horizontal axis indicates binding energy. The origin of the horizontal axis corresponds to the Fermi surface of the substrate, and the left direction with respect to the origin is positive, and the right direction with respect to the origin is negative. Each of the occupied energy levels of the hole injection layer is now described with reference to FIG. 16.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area x that extends in the high binding energy direction from point (iii), and area y that extends in the low binding energy direction (i.e. towards the Fermi surface) from point (iii).

Using the same XPS measurement as described above, it was confirmed that the ratio of the number of atoms of tungsten to the number of atoms of oxygen was nearly 1:3 in both of the samples A and E. Specifically, the composition ratio of tungsten to oxygen within several nanometers in distance from the surface of the hole injection layer was estimated.

Based on this ratio, it can be concluded that in both samples A and E, the hole injection layer has a basic structure with atomic coordinates based on tungsten trioxide (details are provided in the following section), at least to a depth of several nanometers from the surface. Accordingly, region x in FIG. 16 corresponds to an occupied energy level deriving from the above basic structure, i.e. a region corresponding to a so-called valence band. Note that the inventors performed X-ray absorption fine structure (XAFS) measurement with respect to the hole injection layer of both samples A and E and confirmed that the above basic structure is formed therein.

Accordingly, the area y shown in FIG. 16 corresponds to a band gap between the valence band and the conduction band. It is commonly known, however, that an occupied energy level that differs from the occupied energy level of the valence band may exist in this area of the tungsten oxide, as is suggested by the UPS spectrum in FIG. 16. The occupied energy level in area y derives from another structure that is different from the above-mentioned basic structure, and is referred to as a so-called band gap (in-gap state or gap state) energy level.

Figure 17:
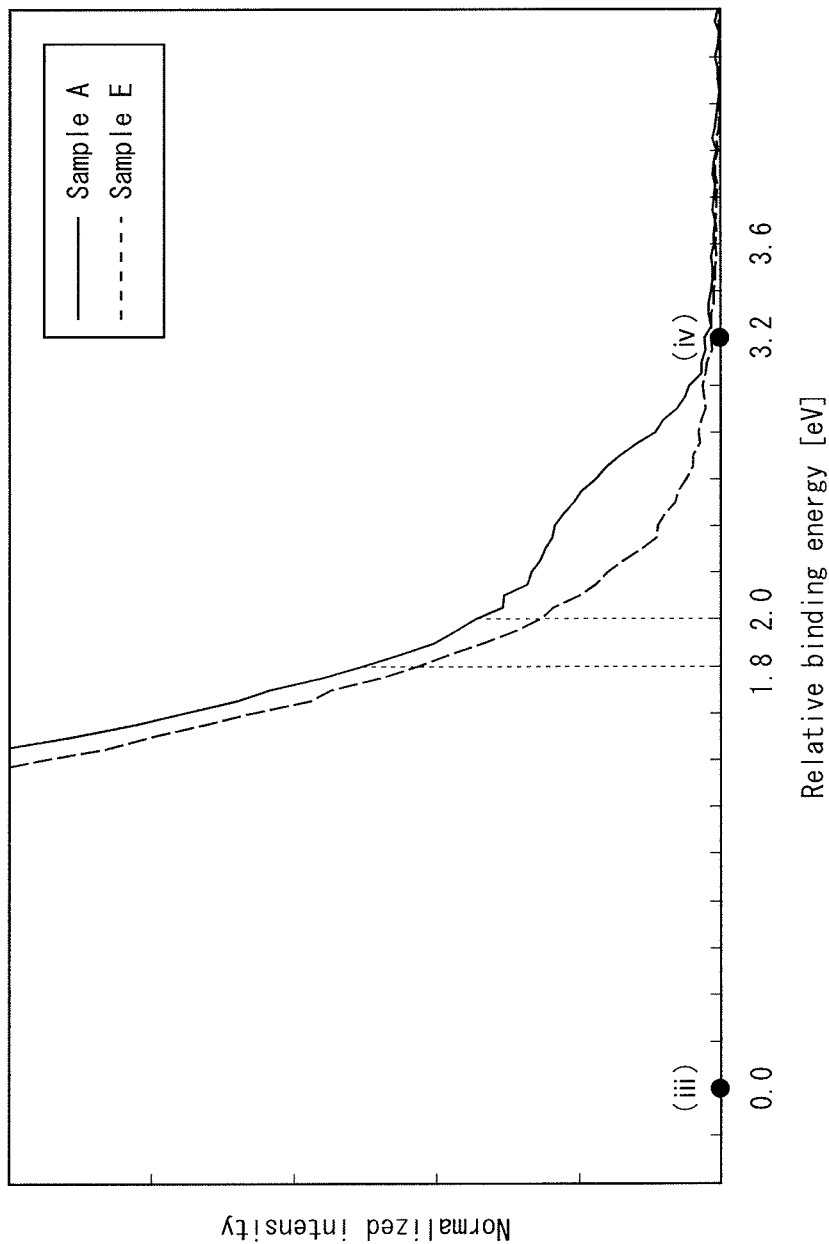
FIG. 17 is a diagram showing UPS spectra of the surface of the tungsten oxide layer.

Next, FIG. 17 shows a UPS spectrum of the hole injection layer in samples A and E within area y. The spectrum intensity indicated by the vertical axis in FIG. 17 has been normalized using the peak-top intensity value of a peak (ii) in FIG. 16, which is located approximately 3 eV to 4 eV to the high binding energy direction from point (iii). In addition, note that point (iii) in FIG. 17 is shown at the same point on the horizontal axis as in FIG. 16. In FIG. 17, the horizontal axis indicates a relative value (relative binding energy) with respect to point (iii), and the binding energy decreases as the relative binding energy increases. That is, a point that is further to the right of point (iii) (or closer to the side of the Fermi surface) has a lower binding energy compared to a point which is closer to point (iii).

As shown in FIG. 17, the spectrum indicating the hole injection layer of sample A exhibits a peak in an area between a point which is 3.6 eV lower in terms of binding energy than point (iii) and a point which is 1.8 eV lower in terms of binding energy than point (iii). Point (iv) in FIG. 17 indicates a point at which such a peak in the spectrum indicating the tungsten oxide layer of the sample device A is first obviously observed. That is, point (iv) is a point at which the peak begins. The existence of such a peak is not observed in the spectrum for sample E.

Forming the hole injection layer from tungsten oxide having a structure such that the UPS spectrum thereof indicates an upward protrusion (not necessarily in the form of a peak) in an area which is between 1.8 eV and 3.6 eV lower in terms of binding energy than point (iii) provides the organic EL panel with excellent hole conduction efficiency.

Furthermore, it has been found that hole injection efficiency is enhanced to a greater extent when the upward protrusion exhibited in the UPS spectrum of the tungsten oxide layer has a higher degree of sharpness. Therefore, as shown in FIG. 17, it can be said that the area that is between 2.0 eV and 3.2 eV lower than point (iii) in terms of binding energy is particularly beneficial, since the upward protrusion is relatively easier to confirm in this area and has a relatively sharper inclination.

(Relationship between Value of $W^{5+}/W^{6+}$ and Driving Voltage)

Figure 18:
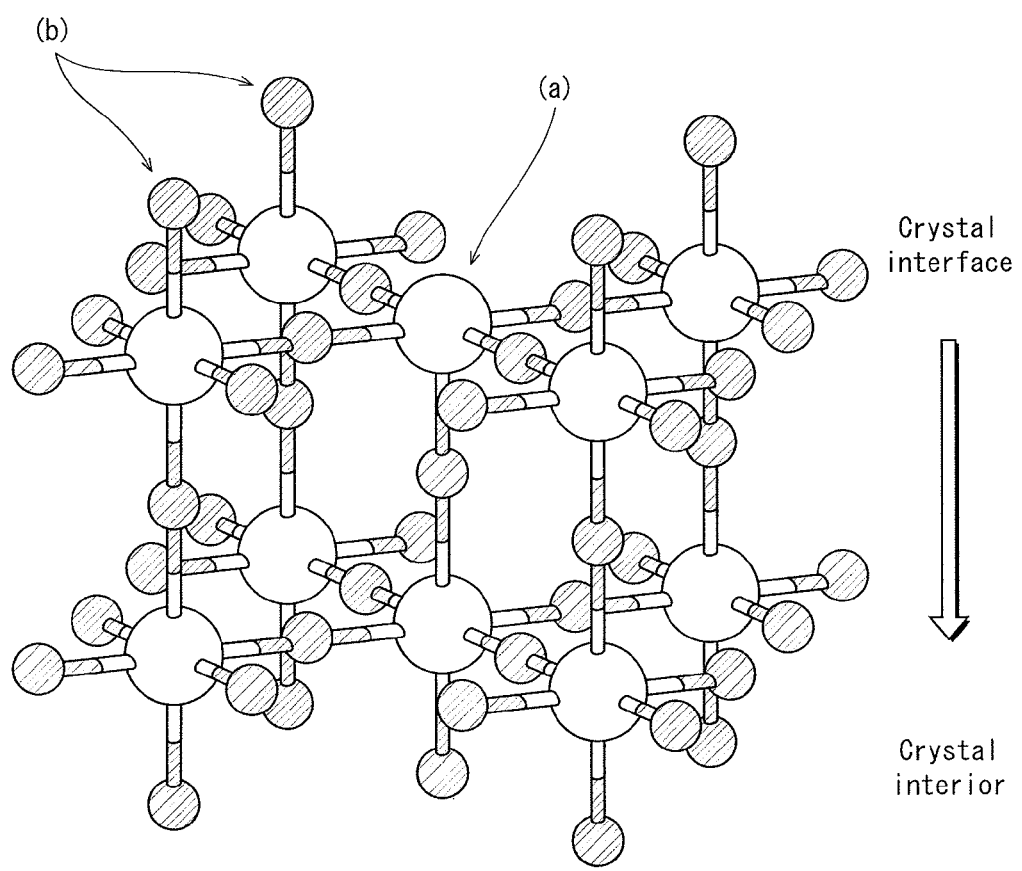
FIG. 18 is a diagram illustrating the structure along the surface of the tungsten oxide layer.

FIG. 18 shows the structure along the surface of the tungsten oxide layer. In this figure, tungsten trioxide ($WO_3$) is used as an example of tungsten oxide. As shown in FIG. 18, the basic structure of a single crystal tungsten oxide is a rutile structure, in which oxygen atoms are bound to a tungsten atom in octahedral coordination. Note that in FIG. 18, a single crystal of tungsten trioxide is shown as having a rutile structure for the sake of illustration. Actual crystals have a distorted rutile structure.

As shown in FIG. 18, tungsten atoms are terminated by oxygen atoms within the crystal. However, at a crystal interface, terminal oxygen atoms (b) and non-terminated tungsten atoms (a), which are entirely or partially surrounded by the terminal oxygen atoms (b), exist. Non-Patent Literature (I. N. Yakovkin et al., Surface Science 601, 1481 (2007)) reports how first principles calculation reveals that a structure where some of the tungsten atoms at the crystal interface remain not terminated (corresponding to the non-terminated tungsten atoms (a)), as in FIG. 18, is more stable in terms of energy than a structure where all of the tungsten atoms at the crystal interface are terminated in oxygen atoms. The reason for this is that when all of the tungsten atoms at the crystal interface are terminated in oxygen atoms, the electric repulsive force between terminal oxygen atoms increases, which results in a loss of stability. In other words, at the crystal interface, the presence of oxygen vacancies or similar structures (a) along the surface results in higher stability.

Tungsten atoms terminated in oxygen atoms, i.e. tungsten atoms not having oxygen vacancies or similar structures (a), correspond to tungsten atoms with a valence of six. On the other hand, tungsten atoms not terminated in oxygen atoms, i.e. tungsten atoms having oxygen vacancies or similar structures (a), correspond to tungsten atoms with a valence of five (including a valence of at least five and less than six).

Tungsten atoms with a valence of five are considered to have a structure with a lone pair of electrons due to the loss of one oxygen atom in octahedral coordination. In other words, it is thought that a tungsten atom with a valence of five supplies a hole with its own lone pair of electrons, so that the tungsten atom with a valence of five that supplied the electrons has a hole. Due to the bias voltage applied to the hole injection layer, this provision of an electron from a lone pair of electrons existing in a tungsten atom with a valence of five is thought to occur continuously, leading to hole conduction in which holes move in the direction of lower electric potential and electrons move in the direction of higher electric potential. The hole injection layer having a high value for $W^{5+}/W^{6+}$ as in sample A, i.e. a high ratio of tungsten atoms with a valence of five, thus has abundant hole conduction paths, allowing for driving at a low voltage due to hole conduction at a low voltage. As a result, the organic EL panel has excellent hole conduction efficiency.

Furthermore, in samples C and D, while the value of $W^{5+}/W^{6+}$ was not as high as sample A, good hole conduction was confirmed even at a value of approximately 3.2%.

(Microstructure of Tungsten in Hole Injection Layer 5)

The tungsten oxide layer constituting the hole injection layer 5 has a nanocrystal structure. This nanocrystal structure is formed by adjusting the film forming conditions. Details concerning this point are provided in the following.

In order to confirm the existence of the nanocrystal structure in the tungsten oxide layer formed under film forming conditions A, B, C, D, and E listed in Table 1, a transmission electron microscope (TEM) measurement experiment was performed.

The tungsten oxide layer in the sample for TEM measurement was formed by the reactive sputtering method using a DC magnetron sputtering device under each set of conditions listed in Table 1. To form each sample, the hole injection layer 5 was formed to a thickness of 30 nm by the above reactive sputtering method on an ITO conductive substrate formed on glass. The samples for TEM measurement manufactured under the film forming conditions A, B, C, D, and E are hereinafter respectively referred to as sample A, sample B, sample C, sample D, and sample E. Note that TEM measurement was performed after confirming, by the above XPS measurement, that tungsten atoms with a valence of five were included in each of the samples A, B, C, and D.

Typically, TEM measurement is performed on a surface by forming a thin sample. A sample according to the present embodiment was manufactured as a cross-section of the tungsten oxide layer by using a focused ion beam (FIB) device to process the sample and adjust the thickness to approximately 100 nm. The conditions for FIB processing and TEM measurement are as follows.

(Conditions for FIB Processing)
Device used: Quanta 200 (manufactured by FEI Company)
Accelerating voltage: 30 kV (final voltage: 5 kV)
Thickness of sample: 50 nm or less
(Conditions for TEM Measurement)
Device used: Topcon EM-002B (manufactured by Topcon Technohouse Corporation)
Measurement method: high-resolution electron microscopy
Accelerating voltage: 200 kV FIG. 19 shows a TEM measurement photograph of a cross-section of the hole injection layer in each of samples A, B, C, D, and E. The scale is indicated by the scale bar in each TEM photograph, and the display size of each TEM photograph is 560×506 pixels. The TEM photographs in FIG. 19 are shown with 256 gradations from the darkest to the brightest region.

In the TEM photographs in FIG. 19, regular linear structures can be observed in samples A, B, C, and D as bright regions aligned in the same direction in portions of samples A, B, C, and D. As is clear from the scale of the TEM photographs, these linear structures are provided at intervals of approximately 1.85 angstroms to 5.55 angstroms.

On the other hand, the bright regions are scattered irregularly in sample E, with no regular linear structures being observable. In the TEM photographs, regions with the above linear structures represent one nanocrystal of tungsten oxide. The TEM photographs thus confirm the presence of the nanocrystal structure of tungsten oxide in samples A, B, C, and D. On the other hand, no nanocrystal structure could be confirmed in sample E.

In the TEM photograph of sample A in FIG. 19, one of the nanocrystals, chosen arbitrarily, is outlined with a white line. Note that this outline is not precise, but rather is meant to be an example. This is because the TEM photograph shows not only the uppermost surface in the cross-section, but also the conditions lower in the layer, thus making it difficult to precisely identify the outline. The size of the nanocrystal outlined with a white line in sample A is approximately between 3 nm and 10 nm.

(Analysis of Hole Conduction of Injected Holes)

As described above, it is considered that the basic structure of a single crystal tungsten oxide is a distorted rutile structure, in which oxygen atoms are bound to a tungsten atom in octahedral coordination. Forming the film from octahedron connections without order and periodicity results in an amorphous structure, whereas forming the film from octahedron connections with order and periodicity results in a nanocrystal structure.

When tungsten atoms with a valence of five are present in the tungsten oxide layer, the tungsten atoms are considered to form a structure with a lone pair of electrons when one of the oxygen atoms in octahedral coordination with a tungsten atom is lost. In other words, it is thought that a tungsten atom with a valence of five supplies a hole with its own lone pair of electrons, so that the tungsten atom with a valence of five that supplied the lone pair of electrons has a hole. Due to the bias voltage applied to the hole injection layer, this provision of an electron from a lone pair of electrons existing in a tungsten atom with a valence of five is thought to occur continuously, leading to hole conduction in which holes move in the direction of lower electric potential and electrons move in the direction of higher electric potential. Accordingly, as more tungsten atoms with a valence of five are included, more tungsten atoms contribute to hole conduction, thus increasing the hole conduction efficiency. The inclusion of numerous tungsten atoms with a valence of five, however, is not a sufficient condition for improving hole conduction properties. The reasons for this are described with reference to FIGS. 20A and 20B.

Figure 20A:
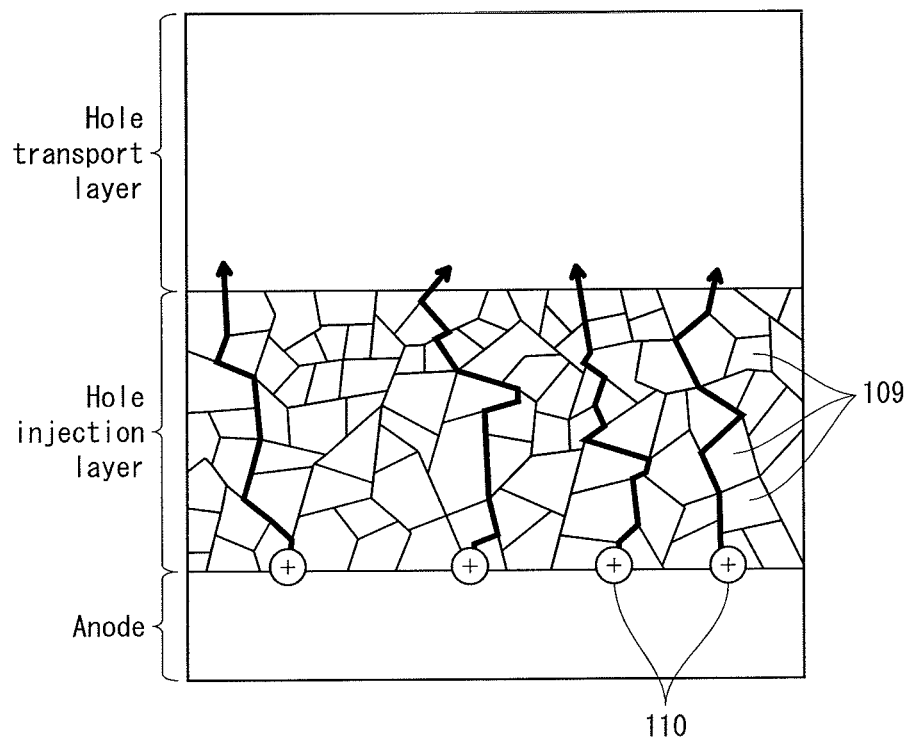
FIG. 20A is a diagram schematically showing hole conduction when the tungsten oxide layer has a nanocrystal structure.
Figure 20B:
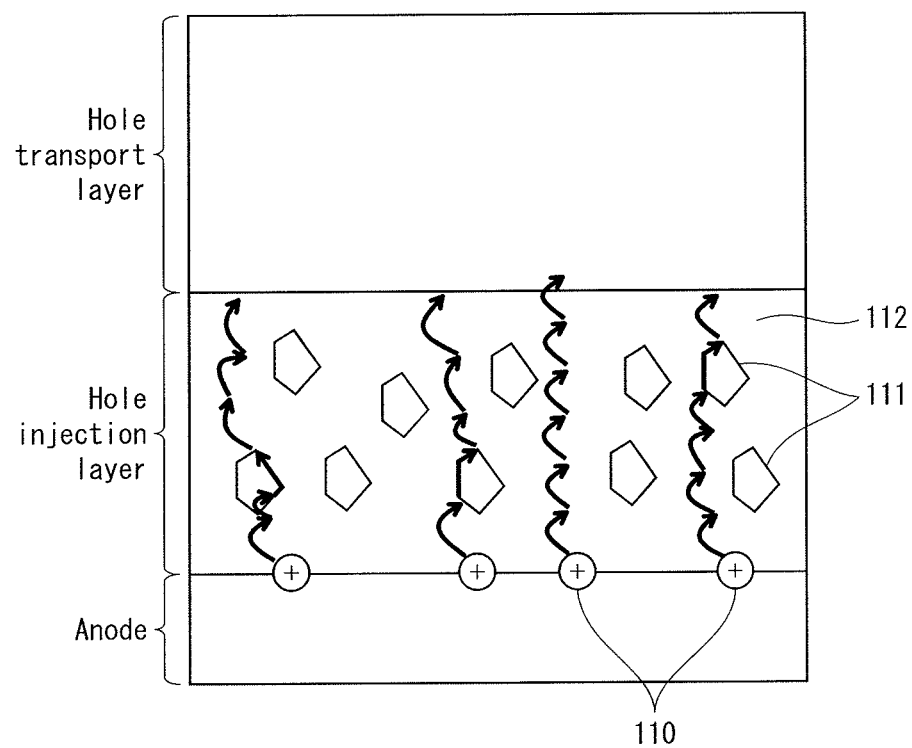
FIG. 20B is a diagram schematically illustrating hole conduction when the tungsten oxide layer has an amorphous structure.

FIG. 20B is a conceptual diagram of conduction of holes 110 by hopping conduction, showing conduction of the holes 110 through an amorphous structure. In the amorphous structure illustrated in FIG. 20B, the portions labeled 111 are crystals with a well-ordered rutile structure (segregated crystals 111). Numerous tungsten atoms with a valence of five are found along the surface of the segregated crystals 111. On the other hand, region 112 excluding the segregated crystals 111 is an amorphous portion in which rutile structures are not well ordered. Not as many tungsten atoms with a valence of five exist as along the surface of the segregated crystals 111. In the amorphous structure, although tungsten atoms with a valence of five exist along the surface of the segregated crystals 111, the orbital of a tungsten atom with the valence of five does not overlap with the orbital of another nearby tungsten atom with a valence of five. Therefore, the holes 110 are thought to be conducted by hopping between tungsten atoms with a valence of five. In other words, in an amorphous structure, tungsten atoms with a valence of five are separated by a long distance. In order to exchange holes between tungsten atoms with the valence of five, which act as hole conduction locations, it becomes necessary to apply an extremely high-voltage across the tungsten atoms with a valence of five, thereby increasing the driving voltage of the organic EL element.

By contrast, FIG. 20A is a conceptual diagram showing the conduction of holes 110 along the surface of nanocrystals in order to illustrate the conduction of the holes 110 in the case of a nanocrystal structure. As shown in FIG. 20A, a nanocrystal structure contains well-ordered rutile structures, so that the entire film is composed of microscopic crystals. The resulting mode of hole conduction differs from an amorphous film. As described above, tungsten atoms with a valence of five exist along the surface of nanocrystals 109, and this surface region becomes a hole conduction region. It is considered that in a nanocrystal structure, the holes 110 can be conducted at a low voltage due to the continuity of surface regions that act as hole conducting regions.

As described above, for a metal oxide film to have good hole conduction properties, it is considered exemplary (1) for portions acting as hole conduction regions to exist, and (2) to increase the number of crystal interfaces in order for electron orbitals contributing to hole conduction to overlap. In other words, a metal oxide film (1) that includes metal atoms with a lower valence than the maximum possible valence of the metal atoms and (2) that has a nanocrystal structure can be considered as having a good structure for hole conduction.

Next, it is described how the effect of improving hole conduction properties is the dominating factor behind achieving a low driving voltage by using tungsten oxide with a nanocrystal structure that includes a low valence. Reduction of driving voltage can also be realized by reducing the hole injection barrier at the interface between the transparent conductive layer 4 and the hole injection layer 5, and by reducing the hole injection barrier at the interface between the hole injection layer 5 and the hole transport layer 7. Here, the hole conduction energy was analyzed by UPS measurement of tungsten oxide layers manufactured in the same way as the hole injection layer 203 in BPD-D and BPD-E, shown in Table 4, which have different hole injection characteristics. As shown in FIG. 13, at a current density of 10 mA/cm$^2$, a difference of approximately 2 V in the driving voltage was confirmed between BPD-D and BPD-E, yet no difference in the hole conduction energy was observed by UPS. In other words, the difference in hole injection voltage between BPD-D and BPD-E was not caused by the hole injection barrier at the interface between the anode 202 and the hole injection layer 203, nor by the hole injection barrier at the interface between the hole injection layer 203 and the hole transport layer 204. Rather, the difference was confirmed to derive from the film structure of the hole injection layer 203, as described above.

<Structure of Display Apparatus 100>

Figure 21:
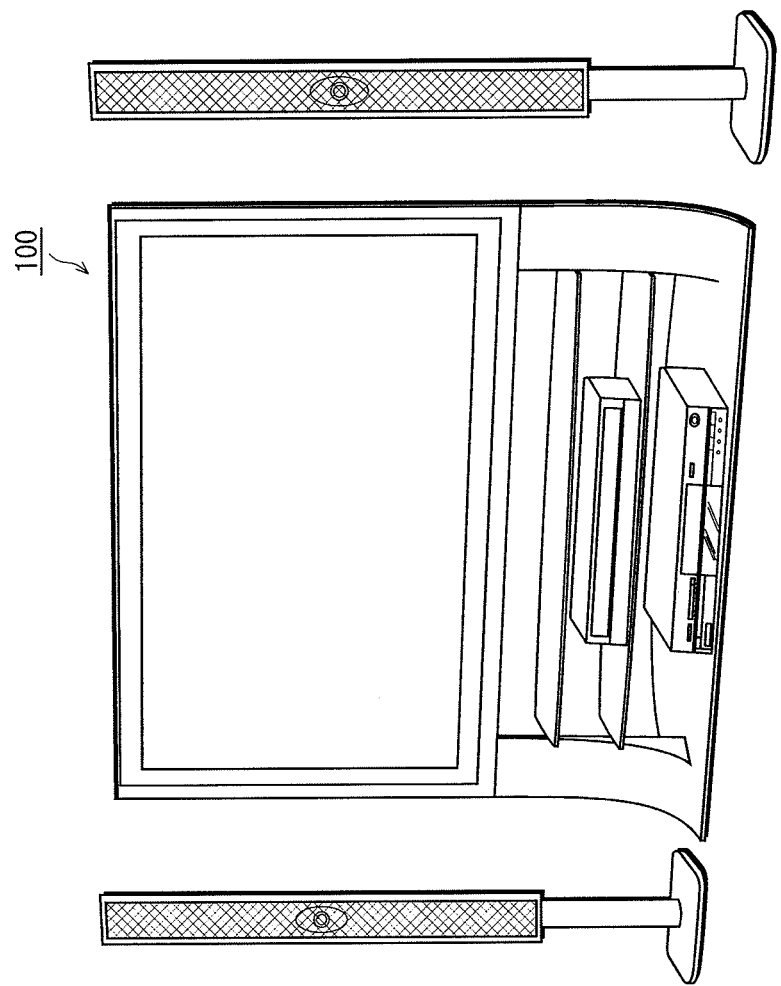
FIG. 21 shows an external view of a display device 100 according to the embodiment.
Figure 22:
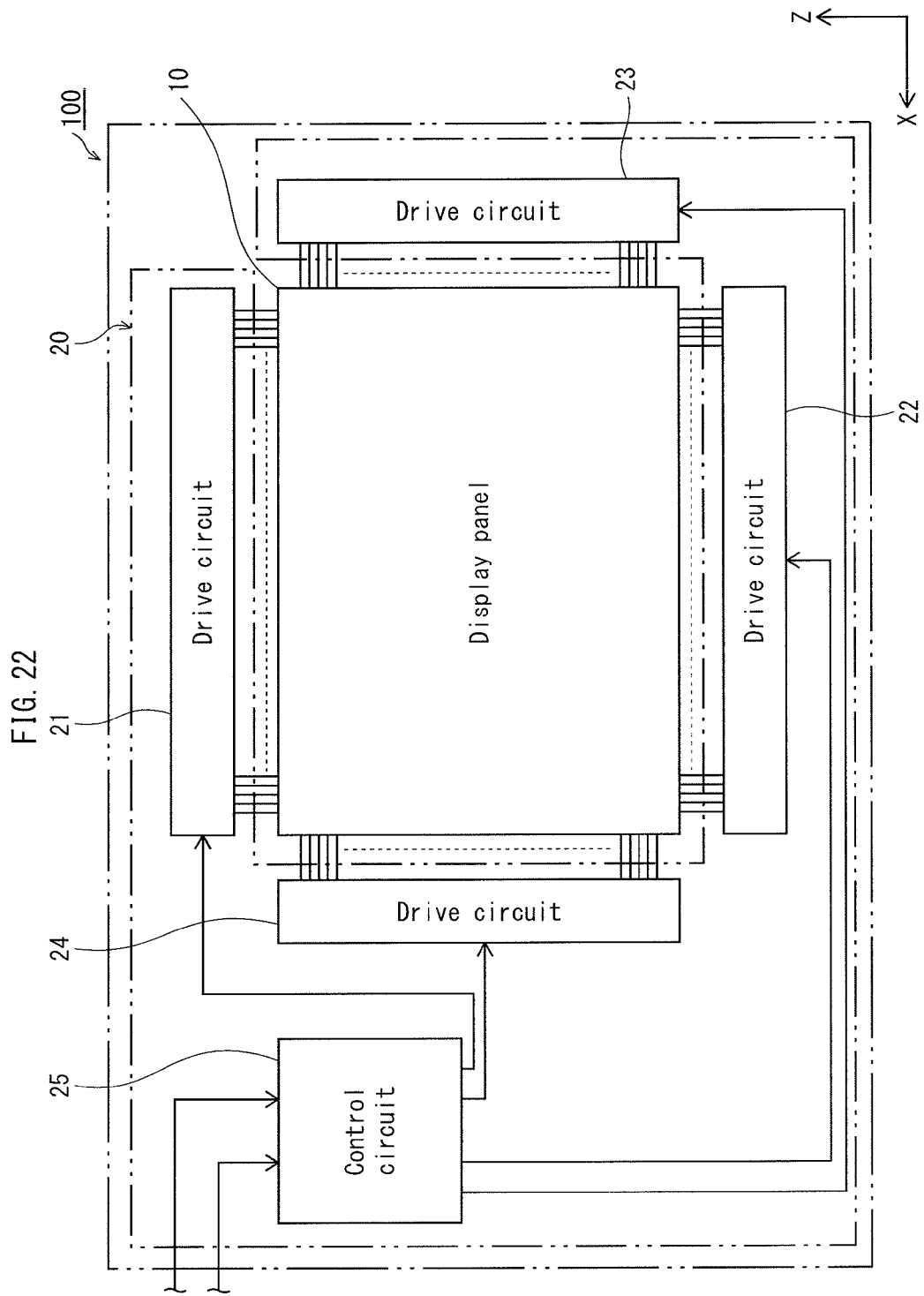
FIG. 22 is a block diagram schematically showing the overall structure of the display device 100 according to the embodiment.

The following describes a display device 100 according to the present embodiment. FIG. 21 shows an external view of the display device 100. FIG. 22 is a block diagram schematically showing the overall structure of the display device 100.

As shown in FIG. 22, the display device 100 includes the organic EL panel 10, and a drive control unit 20 connected to the organic EL panel 10. The organic EL panel 10 is a top emission type organic EL panel utilizing the phenomenon of electroluminescence of organic material.

The drive control unit 20 is composed of four drive circuits 21-24 and a control circuit 25.

However, in an actual display device 100, the arrangement of the drive control unit 20 with respect to the organic EL panel 10 is not limited to those as described above.

As described above, in the organic EL panel 10 according to the present embodiment, the hole transport layers 7 of the R, G, and B colors are equivalent in thickness; the organic light-emitting layers 8 of the R, G, and B colors are also equivalent in thickness; and adjustment is made in the thickness of each of the hole injection layers 5 of the R, G, and B colors. The hole injection layers 5 of the R, G, and B colors are made of only a metal oxide including tungsten oxide (WOx), and each have a thickness of 5 nm to 40 nm.

This makes it possible to cause the driving voltage for obtaining a predetermined current density to be nearly constant, achieving a lower driving voltage as compared to when the thickness of the organic light-emitting layers 8 is adjusted.

Also, in the organic EL panel 10, the thickness of each of the first functional layers of the R, G, and B colors is 36 nm to 69 nm. The optical distance from the organic light-emitting layer 8 of each of the R, G, and B colors and the anode 3 of each of the R, G, and B colors is 72 nm to 131 nm.

This achieves light-extraction efficiency equivalent to that obtained by adjusting the thickness of the organic light-emitting layers 8.

As described above, the organic EL panel 10 realizes light-extraction efficiency equivalent to that obtained by adjusting the thickness of the organic light-emitting layers 8 while reducing the driving voltage.

Furthermore, the organic EL panel 10 realizes chromaticity equivalent to that obtained by adjusting the thickness of the organic light-emitting layers 8.

Also, adjustment of light-extraction efficiency by changing the thickness of each of the hole injection layers of the R, G, and B colors enables reducing, to the maximum extent, the thickness of each of the organic light-emitting layers 8 and the hole transport layers 7 which highly affects the driving voltage.

Although the organic EL panel 10 according to the present invention has been described based on the above embodiment, the present invention is not limited to the above embodiment.

(1) According to the above embodiment, the hole injection layer of each of the R, G, and B colors has a different thickness. However, it is sufficient as long as at least one of the hole injection layers has a thickness different from the other hole injection layers. For example, the hole injection layers of the R and G colors may have the same thickness while the hole injection layer of the B color has a different thickness.

(2) According to the above embodiment, the hole injection layers are formed only from a metal oxide including transition metal oxide. However, the hole injection layer may be formed only from tungsten oxide.

(3) Although description is provided with the display device as an example in the above embodiment, the organic EL panel is also applicable to a light-emitting device.

INDUSTRIAL APPLICABILITY

The present invention is usable in various display devices for home use, for public use, and for business use, televisions, displays for portable electronic devices, and the like.

REFERENCE SIGNS LIST

1 TFT substrate
2 interlayer insulation film
3 anode
4 transparent conductive layer
5 hole injection layer
6 bank
7 hole transport layer
8 organic light-emitting layer
9 electron transport layer
10 organic EL panel
11 cathode
12 passivation layer
20 drive control unit
21-24 drive circuit
25 control circuit
100 display device

The invention claimed is:

1. An organic electroluminescence (EL) panel, comprising:
   anodes that are disposed in one-to-one correspondence with red (R), green (G), and blue (B) colors and reflect light;
   a cathode that is disposed to face the anodes and transmits light therethrough;
   organic light-emitting layers that are disposed between the anodes and the cathode, correspond one-to-one with the R, G, and B colors, and each emit light due to voltage application between the anodes and the cathode; and
   first functional layers that are disposed between the anodes and the organic light-emitting layers, correspond one-to-one with the R, G, and B colors, and are each constituted of at least two layers including a hole injection layer for injecting holes and a hole transport layer provided on the hole injection layer and for transporting the holes to a corresponding one of the organic light-emitting layers, wherein
   a first portion of light of each of the R, G, and B colors emitted from an organic light-emitting layer of a corresponding color travels through a first functional layer of the corresponding color toward an anode of the corresponding color, strikes and is reflected by the anode of the corresponding color, and then emitted externally after passing through the first functional layer of the corresponding color, the organic light-emitting layer of the corresponding color, and the cathode, and
   a second portion of the light of each of the R, G, and B colors travels toward the cathode instead of toward the anode of the corresponding color, and is emitted externally after passing through the cathode,
   the hole injection layer of each of the R, G, and B colors is made of only a metal oxide including tungsten oxide, and has a thickness of 5 nm to 40 nm, of the hole injection layer of at least one of the R, G, and B colors having a thickness different from the hole injection layer of another one of the R, G, and B colors,
   the hole transport layer of each of the R, G, and B colors is equivalent in thickness,
   the organic light-emitting layers of the R, G, and B colors are equivalent in thickness,
   tungsten in the tungsten oxide includes both tungsten with a valence of six, which is a maximum valence thereof, and tungsten with a valence of five, which is lower than the maximum valence, and
   a ratio $W^{5+}/W^{6+}$ of a number of atoms of the tungsten with the valence of five to a number of atoms of the tungsten with the valence of six is at least 3.2%.

2. The organic EL panel of claim 1, wherein
the hole injection layer of each of the R, G, and B colors includes a crystal of the tungsten oxide, the crystal having a particle diameter on an order of nanometers.

3. The organic EL panel of claim 2, wherein
the hole injection layer of each of the R, G, and B colors includes a plurality of crystals of the tungsten oxide, each of the plurality of crystals having a particle diameter of 3 nm to 10 nm.

4. The organic EL panel of claim 1, wherein
the tungsten with the valence of five causes a band structure of the hole injection layer of each of the R, G, and B colors to have an occupied energy level in a range between 1.8 electron volts and 3.6 electron volts lower than a lowest energy level of a valence band in terms of binding energy.

5. The organic EL panel of claim 1, wherein
the first functional layers each have a thickness of 36 nm to 69 nm, and
optical distances between the organic light-emitting layers and the anodes are each 72 nm to 131 nm.

6. The organic EL panel of claim 5, wherein
the hole injection layer of each of the R, G, and B colors has a different thickness.

7. The organic EL panel of claim 5, wherein
the hole injection layer of each of the R, G, and B colors is made of only tungsten oxide.

8. The organic EL panel of claim 5, wherein
the hole injection layer of the R color has a thickness of 36 nm to 40 nm,
the hole injection layer of the G color has a thickness of 30 nm to 34 nm,
the hole injection layer of the B color has a thickness of 8 nm to 12 nm,
the hole transport layer of each of the R, G, and B colors has the equivalent thickness within a range between 7 nm and 13 nm, and
the organic light-emitting layers of the R, G, and B colors have the equivalent thickness within a range between 32 nm and 48 nm.

9. The organic EL panel of claim 5, wherein
the hole injection layer of the R color has a thickness of 36 nm to 40 nm,
the hole injection layer of the G color has a thickness of 26 nm to 30 nm,
the hole injection layer of the B color has a thickness of 4 nm to 8 nm,
the hole transport layer of each of the R, G, and B colors has the equivalent thickness within a range between 12 nm and 18 nm, and
the organic light-emitting layers of the R, G, and B colors have the equivalent thickness within a range between 32 nm and 48 nm.

10. The organic EL panel of claim 5 further comprising
second functional layers that are disposed between the organic light-emitting layers and the cathode, and correspond one-to-one with the R, G, and B colors, wherein
each of the first functional layers of the R, G, and B colors includes a transparent conductive layer formed on the anode of the corresponding color,
the transparent conductive layer of each of the R, G, and B colors are is equivalent in thickness, and
the second functional layers of the R, G, and B colors each include an electron injection transporting layer, the electron injection transporting layer of each of the R, G, and B colors being equivalent in thickness.

11. An organic EL electroluminescence (EL) panel, comprising:
anodes that are disposed in one-to-one correspondence with red (R), green (G), and blue (B) colors and reflect light;
a cathode that is disposed to face the anodes and transmits light therethrough;
organic light-emitting layers that are disposed between the anodes and the cathode, correspond one-to-one with the R, G, and B colors, and each emit light due to voltage application between the anodes and the cathode; and
first functional layers that are disposed between the anodes and the organic light-emitting layers, correspond one-to-one with the R, G, and B colors, and are each constituted of at least two layers including a hole injection layer for injecting holes and a hole transport layer provided on the hole injection layer for transporting the holes to a corresponding one of the organic light-emitting layers, wherein
a first portion of light of each of the R, G, and B colors emitted from an organic light-emitting layer of a corresponding color travels through a first functional layer of the corresponding color toward an anode of the corresponding color, strikes and is reflected by the anode of the corresponding color, and then emitted externally after passing through the first functional layer of the corresponding color, the organic light-emitting layer of the corresponding color, and the cathode, and a second portion of the light of each of the R, G, and B colors travels toward the cathode instead of toward the anode of the corresponding color, and is emitted externally after passing through the cathode,
the hole injection layer of each of the R, G, and B colors is made of only a metal oxide including tungsten oxide, the hole injection layer of the R color having a thickness of 36 nm to 40 nm, the hole injection layer of the G color having a thickness of 30 nm to 34 nm, and the hole injection layer of the B color having a thickness of 8 nm to 12 nm,
the hole transport layer of each of the R, G, and B colors has a thickness of 7 nm to 13 nm,
the organic light-emitting layers of the R, G, and B colors each have a thickness of 32 nm to 48 nm,
tungsten in the tungsten oxide includes both tungsten with a valence of six, which is a maximum valence thereof, and tungsten with a valence of five, which is lower than the maximum valence, and
a ratio $W^{5+}/W^{6+}$ of a number of atoms of the tungsten with the valence of five to a number of atoms of the tungsten with the valence of six is at least 3.2%.

12. The organic EL panel of claim 11, wherein
the hole injection layer of each of the R, G, and B colors includes a crystal of the tungsten oxide, the crystal having a particle diameter on an order of nanometers.

13. The organic EL panel of claim 12, wherein
the hole injection layer of each of the R, G, and B colors includes a plurality of crystals of the tungsten oxide, each of the plurality of crystals having a particle diameter of 3 nm to 10 nm.

14. The organic EL panel of claim 11, wherein
the tungsten with the valence of five causes a band structure of the hole injection layer of each of the R, G, and B colors to have an occupied energy level in a range between 1.8 electron volts and 3.6 electron volts lower than a lowest energy level of a valence band in terms of binding energy.

15. The organic EL panel of claim 11, wherein
the first functional layers each have a thickness of 36 nm to 69 nm, and
optical distances between the organic light-emitting layers and the anodes are each 72 nm to 131 nm.

16. An organic electroluminescence (EL) panel, comprising:
anodes that are disposed in one-to-one correspondence with red (R), green (G), and blue (B) colors and reflect light;
a cathode that is disposed to face the anodes and transmits light therethrough;
organic light-emitting layers that are disposed between the anodes and the cathode, correspond one-to-one with the R, G, and B colors, and each emit light due to voltage application between the anodes and the cathode; and
first functional layers that are disposed between the anodes and the organic light-emitting layers, correspond one-to-one with the R, G, and B colors, and are each constituted of at least two layers including a hole injection layer for injecting holes and a hole transport layer provided on the hole injection layer and for transporting the holes to a corresponding one of the organic light-emitting layers, wherein
a first portion of light of each of the R, G, and B colors emitted from an organic light-emitting layer of a corresponding color travels through a first functional layer of the corresponding color toward an anode of the corresponding color, strikes and is reflected by the anode of the corresponding, and then emitted externally after passing through the first functional layer of the corresponding color, the organic light-emitting layer of the corresponding color, and the cathode, and a second portion of the light of each of the R, G, and B colors travels toward the cathode instead of toward the anode of the corresponding color, and is emitted externally after passing through the cathode, the hole injection layer of each of the R, G, and B colors is made of only a metal oxide including tungsten oxide, the hole injection layer of the R color having a thickness of 36 nm to 40 nm, the hole injection layer of the G color having a thickness of 26 nm to 30 nm, and the hole injection layer of the B color having a thickness of 4 nm to 8 nm, the hole transport layer of each of the R, G, and B colors has a thickness of 12 nm to 18 nm, the organic light-emitting layers of the R, G, and B colors each have a thickness of 32 nm to 48 nm, tungsten in the tungsten oxide includes both tungsten with a valence of six, which is a maximum valence thereof, and tungsten with a valence of five, which is lower than the maximum valence, and a ratio $W^{5+}/W^{6+}$ of a number of atoms of the tungsten with the valence of five to a number of atoms of the tungsten with the valence of six is at least 3.2%.

17. The organic EL panel of claim 16, wherein
the first functional layers each have a thickness of 36 nm to 69 nm, and
optical distances between the organic light-emitting layers and the anodes are each 72 nm to 131 nm.

18. A manufacturing method of an organic electroluminescence (EL) panel, comprising:
disposing anodes that reflect light so as to correspond one-to-one with (R), green (G), and blue (B) colors;
disposing first functional layers over the anodes so as to correspond one-to-one with the R, G, and B colors, each of the first functional layers being constituted of at least two layers including a hole injection layer for injecting holes and a hole transport layer for transporting the holes;
disposing organic light-emitting layers over the first functional layers so as to correspond one-to-one with the R, G, and B colors, each of the organic light-emitting layers emitting light; and
disposing a cathode over the organic light-emitting layers so as to face the anodes, the cathode transmitting the light, wherein
the hole injection layer of each of the R, G, and B colors is formed such that: the hole injection layer of each of the R, G, and B colors is formed from only a metal oxide including tungsten oxide and has a thickness of 5 nm to 40 nm; and the hole injection layer of at least one of the R, G, and B colors has a thickness different from the hole injection layer of another one of the R, G, and B colors,
the organic light-emitting layers are formed to be equivalent in thickness,
tungsten in the tungsten oxide includes both tungsten with a valence of six, which is a maximum valence thereof, and tungsten with a valence of five, which is lower than the maximum valence, and
a ratio $W^{5+}/W^{6+}$ of a number of atoms of the tungsten with the valence of five to a number of atoms of the tungsten with the valence of six is at least 3.2%.

19. The manufacturing method of the organic EL panel of claim 18, wherein
the hole transport layer of each of the R, G, and B colors is formed to be equivalent in thickness, and
the first functional layers are formed such that: the first functional layers each have a thickness of 36 nm to 69 nm; and optical distances between the organic light-emitting layers and the anodes are each 72 nm to 131 nm.

20. The manufacturing method of the organic EL panel of claim 19, wherein
in the disposing the first functional layers:
the hole injection is formed by applying the tungsten oxide to the anodes using a vapor deposition method or a sputtering method; and
the hole transport is formed by applying ink to the hole injection layer using a printing method or an inkjet method, the ink including a hole transport material, and
in the disposing the organic light-emitting layers, the organic light-emitting layers are formed by applying ink to the hole transport layer using the printing method or the inkjet method, the ink including an organic light-emitting material.

21. The manufacturing method of the organic EL panel of claim 19, wherein
forming of the hole injection layer for each of the R, G, and B colors in the disposing the first functional layers includes:
forming, on the anodes, a tungsten oxide layer including the tungsten oxide;
laminating a photoresist layer including a photoresist material on the tungsten oxide layer;
adjusting a thickness of the photoresist layer, such that the thickness differs at each of portions of the photoresist layer corresponding to the R, G, and B colors, by selectively exposing the photoresist layer to light with use of a mask having a light transmittance that differs at each of portions of the mask corresponding to the R, G, and B colors;
shaping the tungsten oxide layer so that portions thereof corresponding to the R, G, and B colors each have a different thickness, by etching, with use of a developing solution, the photoresist layer whose thickness has been adjusted and removing portions of the tungsten oxide layer, including a top thereof, with use of the developing solution; and
removing the photoresist layer from the tungsten oxide layer after the shaping.

22. The manufacturing method of the organic EL panel of claim 19, further comprising:
between the disposing the organic light-emitting layers and the disposing the cathode, disposing second functional layers on the organic light-emitting layers so as to correspond one-to-one with the R, G, and B colors, wherein
each of the first functional layers of the R, G, and B colors is formed to further include a transparent conductive layer, each of the transparent conductive layer of each of the R, G, and B colors being formed on a corresponding one of the anodes and being equivalent in thickness, and
each of the second functional layers of the R, G, and B colors is formed to include an electron injection transporting layer, the electron injection transporting layer of each of the R, G, and B colors being equivalent in thickness.

23. The manufacturing method of the organic EL panel of claim 18, wherein
in the disposing the first functional layers, the hole injection layer is formed with a sputtering gas including argon gas and oxygen gas, using tungsten as a sputtering target, under film forming conditions such that a total pressure of the sputtering gas is 2.3 Pa to 7.0 Pa, a partial pressure of the oxygen gas in the sputtering gas is 50% to 70%, an input power density per unit area of the sputtering target is 1.5 W/cm$^2$ to 6.0 W/cm$^2$, and a value yielded by dividing the total pressure of the sputtering gas by the input power density is larger than 0.7 Pa·cm$^2$/W.

24. The manufacturing method of the organic EL panel of claim 23, wherein
the tungsten in the tungsten oxide includes a tungsten oxide crystal having a particle diameter on an order of nanometers.

25. The manufacturing method of the organic EL panel of claim 23, wherein
the value yielded by dividing the total pressure of the sputtering gas by the input power density is less than 3.2 Pa·cm$^2$/W.

26. An organic light-emitting device using an organic EL panel manufactured by the manufacturing method of claim 18.

27. An organic display device using an organic EL panel manufactured by the manufacturing method of claim 18.

* * * * *